(12) United States Patent
Lee et al.

(10) Patent No.: US 12,414,450 B2
(45) Date of Patent: Sep. 9, 2025

(54) DISPLAY DEVICE INCLUDING AN INPUT SENSOR, ELECTRONIC DEVICE, AND METHOD FOR MANUFACTURING THE DISPLAY DEVICE

(71) Applicant: SAMSUNG DISPLAY CO., LTD., Yongin-si (KR)

(72) Inventors: Seungchan Lee, Yongin-si (KR); Cheolku Kang, Yongin-si (KR); Sanghyun Lim, Yongin-si (KR); Sanghyun Jun, Yongin-si (KR); Hyunjee Jeon, Yongin-si (KR); Kangwon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/651,132

(22) Filed: Apr. 30, 2024

(65) Prior Publication Data

US 2025/0072236 A1  Feb. 27, 2025

(30) Foreign Application Priority Data

Aug. 25, 2023  (KR) .......................... 10-2023-0111711

(51) Int. Cl.
| | |
|---|---|
| *H10K 59/131* | (2023.01) |
| *G06F 3/0354* | (2013.01) |
| *H10K 59/12* | (2023.01) |
| *H10K 59/121* | (2023.01) |
| *H10K 59/122* | (2023.01) |

(52) U.S. Cl.
CPC ....... *H10K 59/131* (2023.02); *G06F 3/03545* (2013.01); *H10K 59/1201* (2023.02); *H10K 59/121* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 5,130,500 | A | 7/1992 | Murakami et al. |
| 8,963,889 | B2 | 2/2015 | Oda et al. |
| 2018/0129352 | A1* | 5/2018 | Kim ...................... G06F 3/0446 |
| 2021/0173245 | A1 | 6/2021 | Kurasawa et al. |
| 2021/0333934 | A1 | 10/2021 | Kishimoto et al. |
| 2022/0291760 | A1* | 9/2022 | Jeon ...................... H02J 7/0042 |

FOREIGN PATENT DOCUMENTS

| | | |
|---|---|---|
| JP | 20200095075 A | 6/2020 |
| JP | 20200095075 U | 6/2020 |
| JP | 7355881 B2 | 10/2023 |
| KR | 10-2023-0010742 A | 1/2023 |

* cited by examiner

*Primary Examiner* — Stephen T. Reed
(74) *Attorney, Agent, or Firm* — F. CHAU & ASSOCIATES, LLC

(57) ABSTRACT

A display device includes a display panel including a display region and a non-display region proximate to the display region. An input sensor is disposed on the display panel and includes a sensing electrode configured to detect an electromagnetically induced current. The display panel includes a base layer including a plurality of resin layers, a plurality of pixels disposed on the base layer and overlapping the display region, and a charge electrode disposed below at least one of the plurality of resin layers and overlapping the display region.

23 Claims, 24 Drawing Sheets

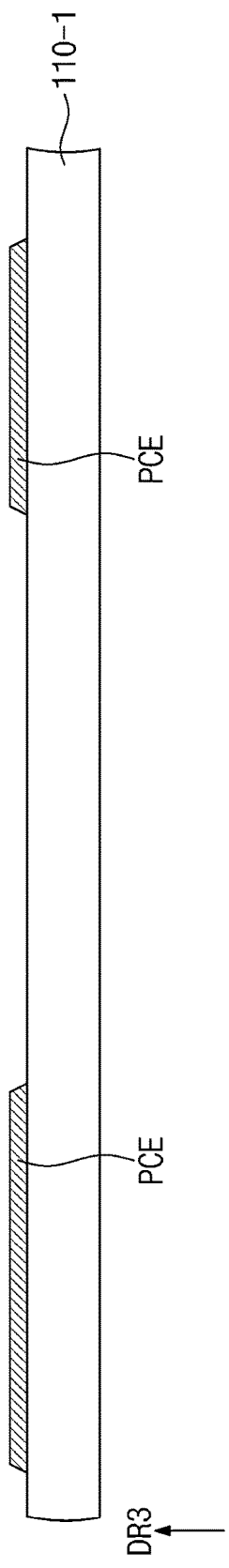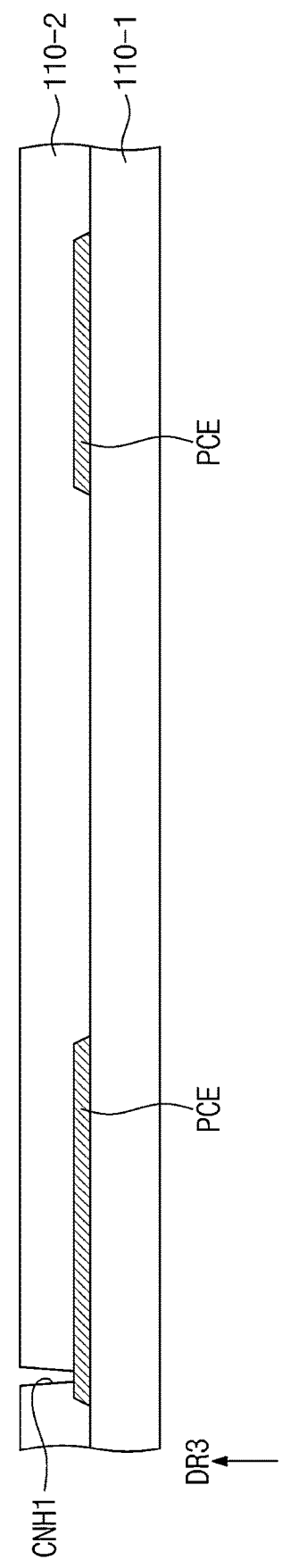

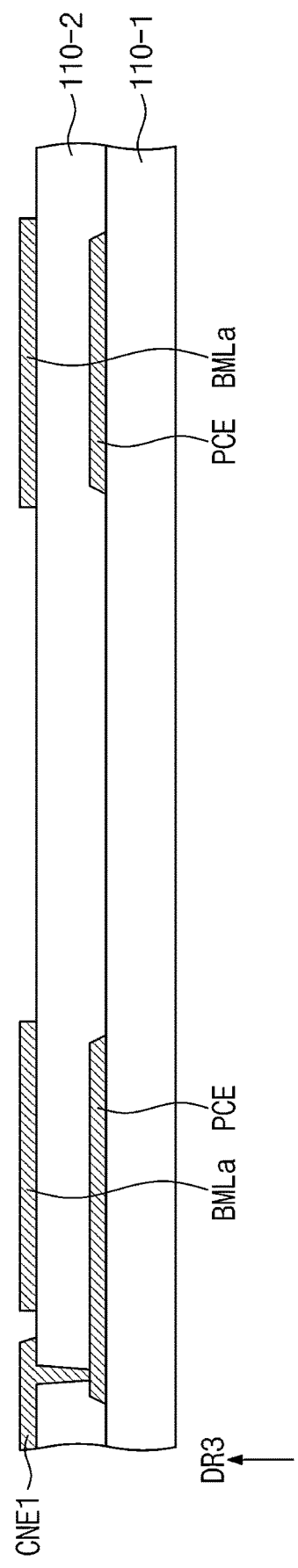

DISPLAY DEVICE INCLUDING AN INPUT SENSOR, ELECTRONIC DEVICE, AND METHOD FOR MANUFACTURING THE DISPLAY DEVICE

CROSS-REFERENCE TO RELATED APPLICATIONS

This U.S. non-provisional patent application claims priority under 35 U.S.C. § 119 to Korean Patent Application No. 10-2023-0111711, filed on Aug. 25, 2023, the entire contents of which are hereby incorporated by reference.

TECHNICAL FIELD

The present disclosure relates to a display device, an electronic device, and a method for manufacturing the display device, and more particularly, to a display device including an input sensor, an electronic device, and a method for manufacturing the display device.

DISCUSSION OF THE RELATED ART

Various types of display devices used for multimedia devices such as mobile phones, tablet computers, navigation systems, and portable game consoles have been developed. Input devices for the display devices include a keyboard or a mouse. In addition, the display devices are provided with input sensors as the input devices.

The input sensors may detect user inputs through a capacitive mode or a self-capacitance mode. The input sensors may also detect inputs from a stylus pen through electromagnetic induction.

SUMMARY

A display device includes a display panel including a display region and a non-display region at least partially surrounding the display region. An input sensor is disposed on the display panel and includes a sensing electrode detecting an electromagnetically induced current. The display panel includes a base layer including a plurality of resin layers, a plurality of pixels disposed on the base layer and overlapping the display region, and a charge electrode disposed below at least one of the plurality of resin layers and overlapping the display region.

The charge electrode may be disposed on the first resin layer and may be covered by the second resin layer.

The display panel may further include a shielding pattern disposed on the second resin layer and overlapping the charge electrode.

The display panel may further include a connection line connected to the charge electrode through a contact hole passing through the second resin layer, and including a same material as found in the shielding pattern.

The base layer may further include a third resin layer disposed below the first resin layer. The charge electrode may be disposed on the third resin layer and may be covered by the first resin layer.

The display device may further include a flexible circuit board, at least a portion of which is disposed below the display panel. The charge electrode may be electrically connected to the flexible circuit board through a contact hole defined in the third resin layer.

The display panel may further include an encapsulation layer disposed on the base layer and covering the plurality of pixels. The input sensor may be directly disposed on the encapsulation layer.

The plurality of pixels may each include a light emitting element and at least one transistor connected to the light emitting element. The charge electrode may overlap at least a portion of the light emitting element.

The charge electrode may define a current path that receives a constant voltage and generates a magnetic field therefrom.

The charge electrode may include a plurality of unit charge electrodes extending in a first direction and spaced apart from one another in a second direction crossing the first direction.

The charge electrode may include molybdenum, silver, titanium, copper, and/or aluminum.

The charge electrode may have a thickness of about 0.1 μm to about 1 μm.

At least a portion of the charge electrode may include conductive lines having a mesh shape. The conductive lines may be patterned to correspond to at least some of the plurality of pixels.

The sensing electrode may have a thickness of about 0.1 μm to about 1 μm.

The sensing electrode may have a line resistance of about 100Ω or less.

At least a portion of the sensing electrode may be in a mesh shape.

The sensing electrode may include a first group of first electrodes extending in a first direction, a first group of second electrodes extending in a second direction crossing the first direction and capacitively coupled to the first group of first electrodes, a second group of first electrodes extending in the first direction and configured to detect the electromagnetically induced current, and a second group of second electrodes extending in the second direction and configured to detect the electromagnetically induced current.

The input sensor may further include a first group of first signal lines connected to one end of the first group of first electrodes, a first group of second signal lines connected to one end of the first group of second electrodes, a second group of first signal lines connected to one end of the second group of first electrodes, and a second group of second signal lines connected to one end of the second group of second electrodes.

The first group of the first electrodes may include a (1-1)-th extension portion extending in the first direction, a (1-2)-th extension portion extending in the first direction and spaced apart from the (1-1)-th extension portion in the second direction, and a first middle portion disposed between one end of the (1-1)-th extension portion and one end of the (1-2)-th extension portion. The first electrode of the second group may be disposed between the (1-1)-th extension portion and the (1-2) extension portion.

The first of the second electrodes may include a (2-1)-th extension portion extending in the second direction, a (2-2)-th extension portion extending in the second direction and spaced apart from the (2-1)-th extension portion in the first direction, and a second middle portion disposed between one end of the (2-1)-th extension portion and one end of the (2-2)-th extension portion. The second electrode of the second group may be disposed between the (2-1)-th extension portion and the (2-2) extension portion.

An electronic device includes a housing, an electronic module disposed inside the housing, a display device overlapping the electronic module, and a stylus pen including a resonance circuit. The display device includes a display panel including a display region and a non-display region at least partially surrounding the display region, and an input sensor disposed on the display panel and configured to detect a resonance signal transmitted from the stylus pen. The display panel includes a base layer including a plurality of resin layers, a plurality of pixels disposed on the base layer and overlapping the display region, and a charge electrode charging the stylus pen. The plurality of resin layers include a first resin layer, and a second resin layer disposed on the first resin layer, and the charge electrode is disposed below the second resin layer.

A method for manufacturing a display device includes providing a display panel including a display region and a non-display region at least partially surrounding the display region. An input sensor is formed including a sensing electrode disposed on the display panel. The providing of the display panel includes providing a base including a plurality of resin layers and a charge electrode, and forming a plurality of pixels on the base to overlap the display region. The providing of the base includes providing a lower resin layer, patterning a metal material on the lower resin layer to form the charge electrode, and forming an upper resin layer covering the charge electrode.

The providing of the base may further include forming a contact hole in the lower resin layer or the upper resin layer to electrically connect the charge electrode to a connection line.

The providing of the display panel may further include forming an encapsulation layer covering the plurality of pixels. The input sensor may be formed on the encapsulation layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 17A to 17D are cross-sectional views showing a step in a method for manufacturing a display device according to an embodiment of the inventive concept.

DETAILED DESCRIPTION

Figure 1A:
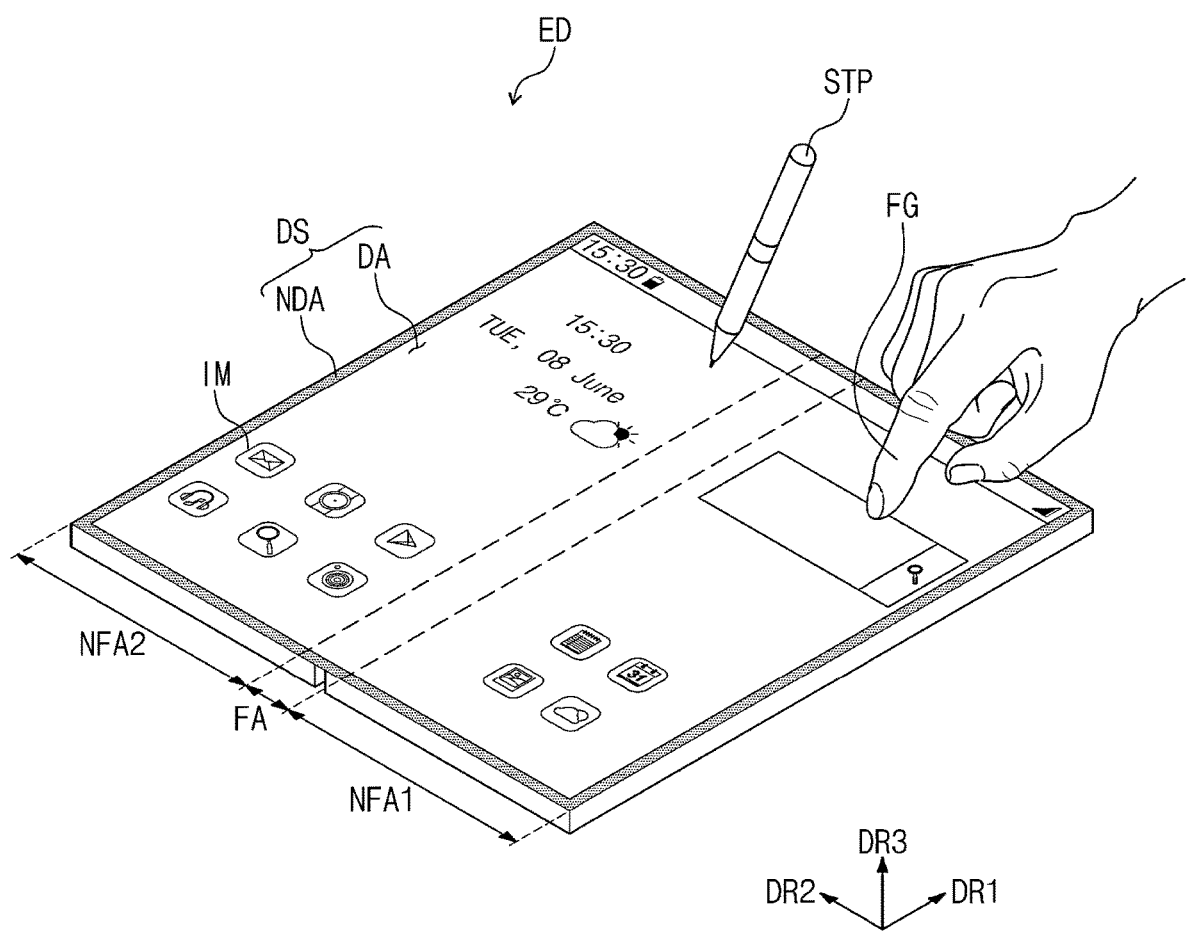
FIGS. 1A to 1C are perspective views of an electronic device according to an embodiment of the inventive concept.

It will be understood that when an element (or a region, a layer, a portion, or the like) is referred to as "being on", "connected to" or "coupled to" another element, it may be directly disposed on, connected or coupled to the other element, or intervening elements may be disposed therebetween.

However, in this application, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, disposed therebetween.

Like numbers may refer to like elements throughout the specification and the drawings. While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like. The term "and/or," includes all combinations of one or more of which associated configurations may define.

It will be understood that, although the terms first, second, etc. may be used herein to describe various elements, these elements should not necessarily be limited by these terms. These terms are used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the inventive concept will be described with reference to the accompanying drawings.

Figure 1B:
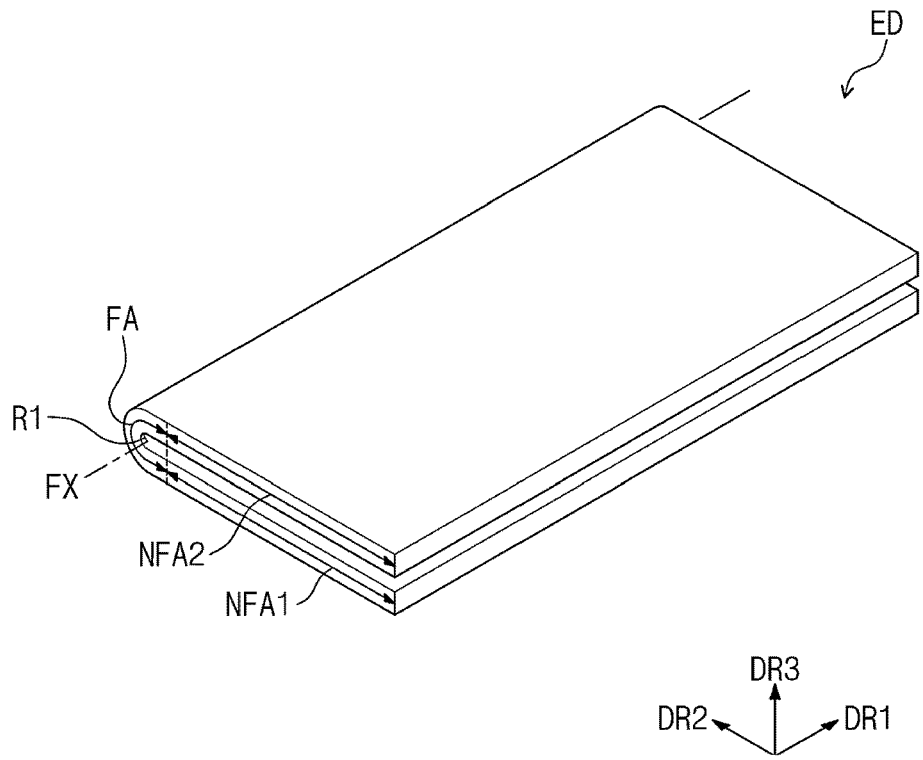
Figure 1C:
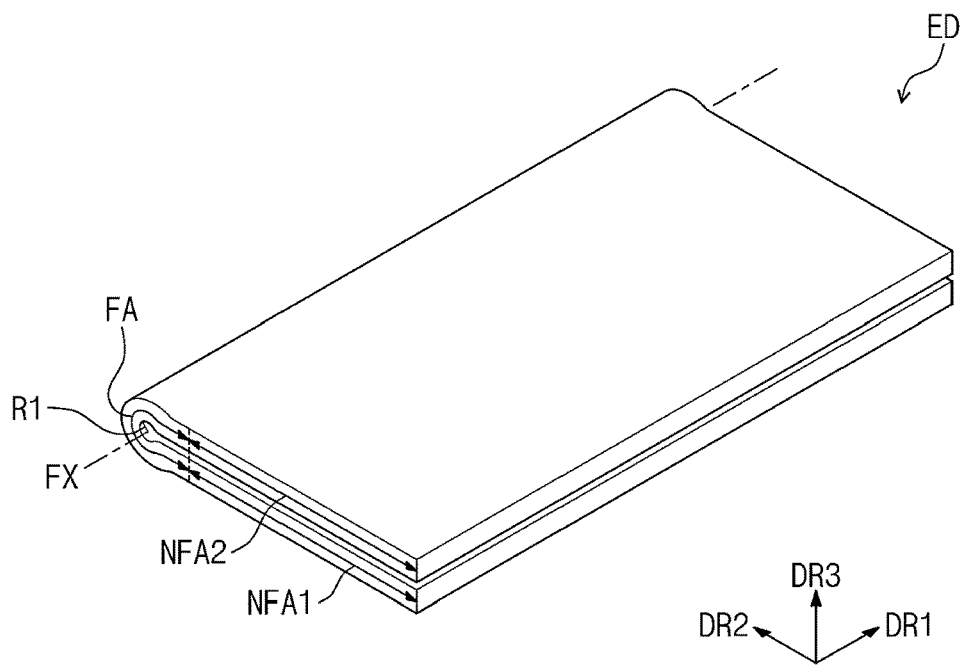

FIGS. 1A to 1C are perspective views of an electronic device ED according to an embodiment of the inventive concept. FIG. 1A shows an unfolded state, and FIGS. 1B and 1C show a folded state.

Referring to FIGS. 1A to 1C, the electronic device ED, according to an embodiment of the inventive concept, may include a display surface DS defined by a first direction DR1 and a second direction DR2 crossing the first direction DR1. The electronic device ED may provide an image IM to users through the display surface DS.

The display surface DS may include a display region DA and a non-display region NDA at least partially surrounding the display region DA. The display region DA may display the image IM, and the non-display region NDA might not display the image IM. The non-display region NDA may surround the display region DA. However, the embodiment of the inventive concept is not necessarily limited thereto, and the shape of the display region DA and the shape of the non-display region NDA may be modified.

Hereinafter, a direction substantially perpendicularly crossing a plane defined by the first direction DR1 and the second direction DR2 is defined as a third direction DR3. Front and rear surfaces of each member are distinguished from each other with respect to the third direction DR3. In addition, as used herein, "when viewed on a plane" or "in a plan view" may be defined as a state viewed in the third direction DR3. Hereinafter, the first, second, and third directions DR1, DR2, and DR3 are directions respectively indicated by first, second, and third directional axes, and are assigned with the same reference numerals as those of the first, second, and third directional axes.

The electronic device ED may include a folding region FA and a plurality of non-folding regions NFA1 and NFA2. The non-folding regions NFA1 and NFA2 may include a first non-folding region NFA1 and a second non-folding region NFA2. In the second direction DR2, the folding region FA may be disposed between the first non-folding region NFA1 and the second non-folding region NFA2. In the present embodiment, a foldable electronic device ED is shown as an example, but the embodiment of the inventive concept is not necessarily limited thereto. The electronic device ED may be bar type (e.g., a rigid rectangle), rollable, or slidable.

The electronic device ED may detect inputs from a stylus pen STP and inputs from a body part of a user FG. Fingers are shown as the body part of a user FG. The electronic device ED may detect inputs from the body part of a user FG during a first mode section and inputs from the stylus pen STP during a second mode section through time division driving.

As shown in FIG. 1B, the folding region FA may be folded with respect to a folding axis FX that extends in the first direction DR1. The folding region FA has a predetermined curvature and a predetermined radius of curvature R1. The first non-folding region NFA1 and the second non-folding region NFA2 face each other, and the electronic device ED may be in-folded such that the display surface DS folds onto itself and is not exposed to the outside.

In an embodiment of the inventive concept, the electronic device ED may be out-folded such that the display surface DS is folded so that each side sits back-to-back and the display surface DS is exposed to the outside. In an embodiment of the inventive concept, the electronic device ED may be configured such that an in-folding operation or an out-folding operation is mutually repeated from an unfolding operation, but the embodiment of the inventive concept is not necessarily limited thereto. In an embodiment of the inventive concept, the electronic device ED may be configured to select any one of an unfolding operation, an inner-folding operation, or an outer-folding operation.

As shown in FIG. 1B, a distance between the first non-folding region NFA1 and the second non-folding region NFA2 may be substantially equal to twice the radius of curvature R1, but as shown in FIG. 1C, a distance between the first non-folding region NFA1 and the second non-folding region NFA2 may be less than twice the radius of curvature R1. FIGS. 1B and 1C are shown with respect to the display surface DS, and a housing HM (see FIG. 2) constituting an outer portion of the electronic device ED may be in contact with end regions of the first non-folding region NFA1 and the second non-folding region NFA2.

In the present embodiment, an electronic device ED that may be applicable to mobile phones is shown as an example. A mobile phone may be formed by placing electronic modules, camera modules, power modules, and the like mounted on a motherboard in a bracket/case along with a display device DD. However, the embodiment of the inventive concept is not necessarily limited thereto, and the electronic device ED, according to an embodiment of the inventive concept, might not only be used for large-sized electronic devices such as television sets and monitors but also used for small- and medium-sized electronic devices such as tablet terminals, car navigation systems, game consoles, and smartwatches.

Figure 2:
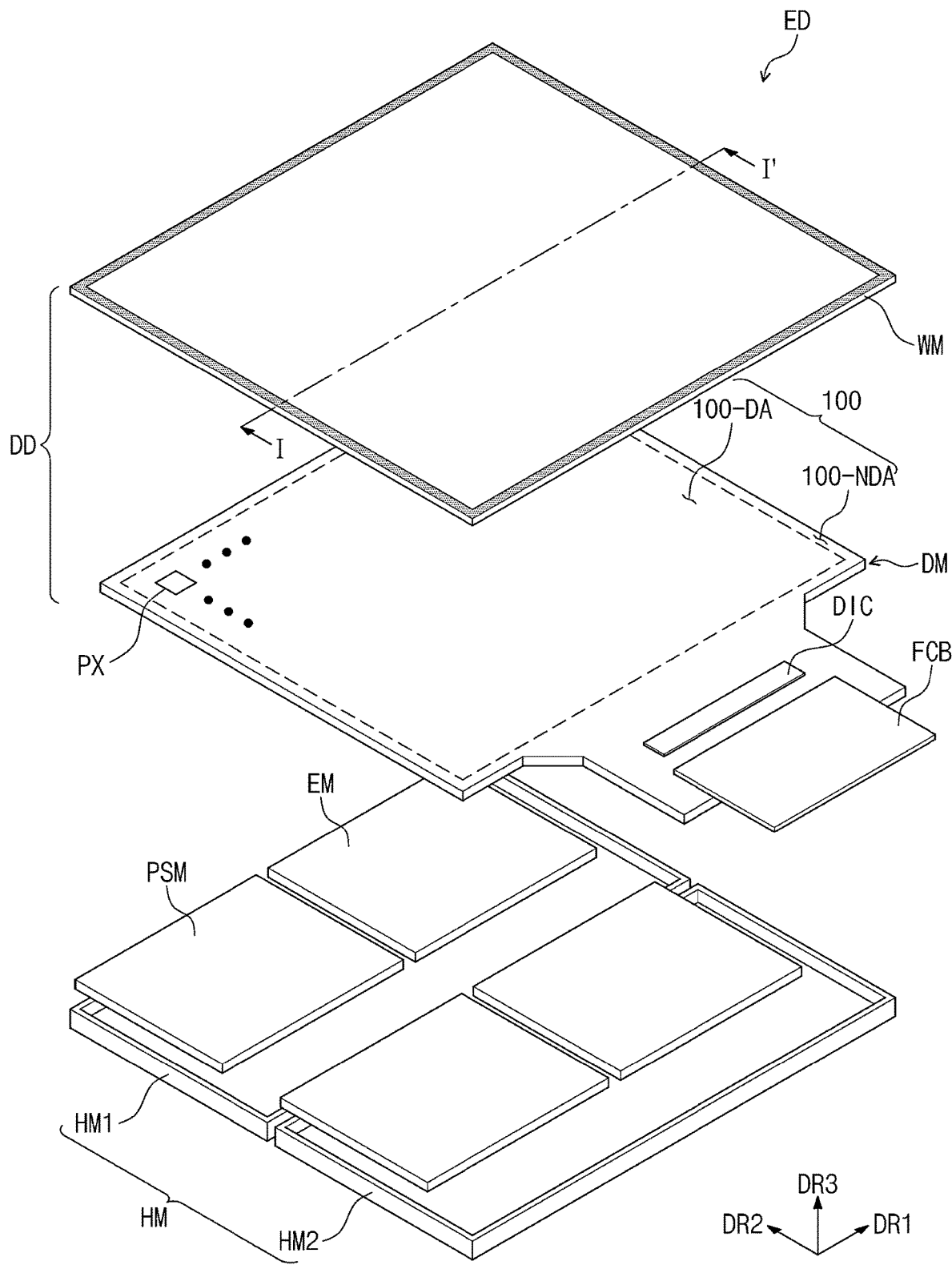
FIG. 2 is an exploded perspective view of an electronic device according to an embodiment of the inventive concept.

FIG. 2 is an exploded perspective view of an electronic device ED according to an embodiment of the inventive concept.

As shown in FIG. 2, the electronic device ED may include a display device DD, an electronic module EM, a power module PSM, and a housing HM. The electronic device ED may further include a mechanical structure configured to control a folding operation of the display device DD. An adhesive layer may be used to bond the components shown in FIG. 2.

The display device DD generates images and detects external inputs. The display device DD may include a window WM and a display module DM. The window WM provides a front surface of the electronic device ED. The display device DD may further include an additional component between the window WM and the display module DM, or may further include an additional component below the display module DM.

The display module DM may include at least a display panel 100. FIG. 2 shows only the display panel 100 among the stack structures of the display module DM, but the display module DM may further include a plurality of components disposed at an upper side of the display panel 100. Detailed descriptions of the stacked structure of the display module DM will be described later.

The display panel 100 is not necessarily particularly limited to the depicted arrangement, and may be, for example, a light emitting display panel such as an organic light emitting diode (OLED) display panel or a quantum dot light emitting display panel.

The display panel 100 includes a display region 100-DA and a non-display region 100-NDA corresponding to the display region DA (see FIG. 1A) and the non-display region NDA (see FIG. 1A) of the electronic device ED. A pixel PX is disposed in the display region 100-DA. In the non-display region 100-NDA, the pixel PX is not disposed, and signal lines that provide voltage to the pixel PX are disposed. As used herein, the phrase "a region/portion corresponds to a region/portion" indicates that they overlap and are not necessarily limited to the same area.

As shown in FIG. 2, a driving chip DIC may be disposed on the non-display region 100-NDA of the display panel 100. A flexible printed circuit board FCB may be bonded to the non-display region 100-NDA of the display panel 100. The flexible circuit board FCB may be connected to a main circuit board. The main circuit board may be one electronic component constituting the electronic module EM. In addition, the electronic module EM may further include a control module (e.g., application processor), a wireless communication module, an image input module, and the like. For example, unlike what is shown in FIG. 2, a portion of the flexible printed circuit board FCB may be disposed below the display panel 100. In the electronic device ED of an embodiment, a portion of the flexible printed circuit board FCB or the display module DM is bent, and thus the portion of the flexible printed circuit board FCB may be disposed below the display panel 100.

The driving chip DIC may include driving elements, for example, a data driving circuit, for driving the pixel PX of the display panel 100. FIG. 2 shows a structure in which the driving chip DIC is mounted on the display panel 100, but the embodiment of the inventive concept is not necessarily limited thereto. For example, the driving chip DIC may be mounted on the flexible circuit board FCB.

Referring to FIG. 2, the electronic module EM may be disposed in each of a first housing HM1 and a second housing HM2, and the power module PSM may be disposed in each of the first housing HM1 and the second housing HM2. The electronic module EM disposed in the first housing HM1 and the electronic module EM disposed in the second housing HM2 may be electrically connected through a flexible circuit board. A housing HM is bonded to the display device DD, particularly the window WM, to accommodate other modules described above. The housing HM is shown to include the first and second housings HM1 and HM2 which are separated, but is not necessarily limited thereto. The electronic device ED may further include a hinge structure configured to connect the first and second housings HM1 and HM2.

Figure 3:
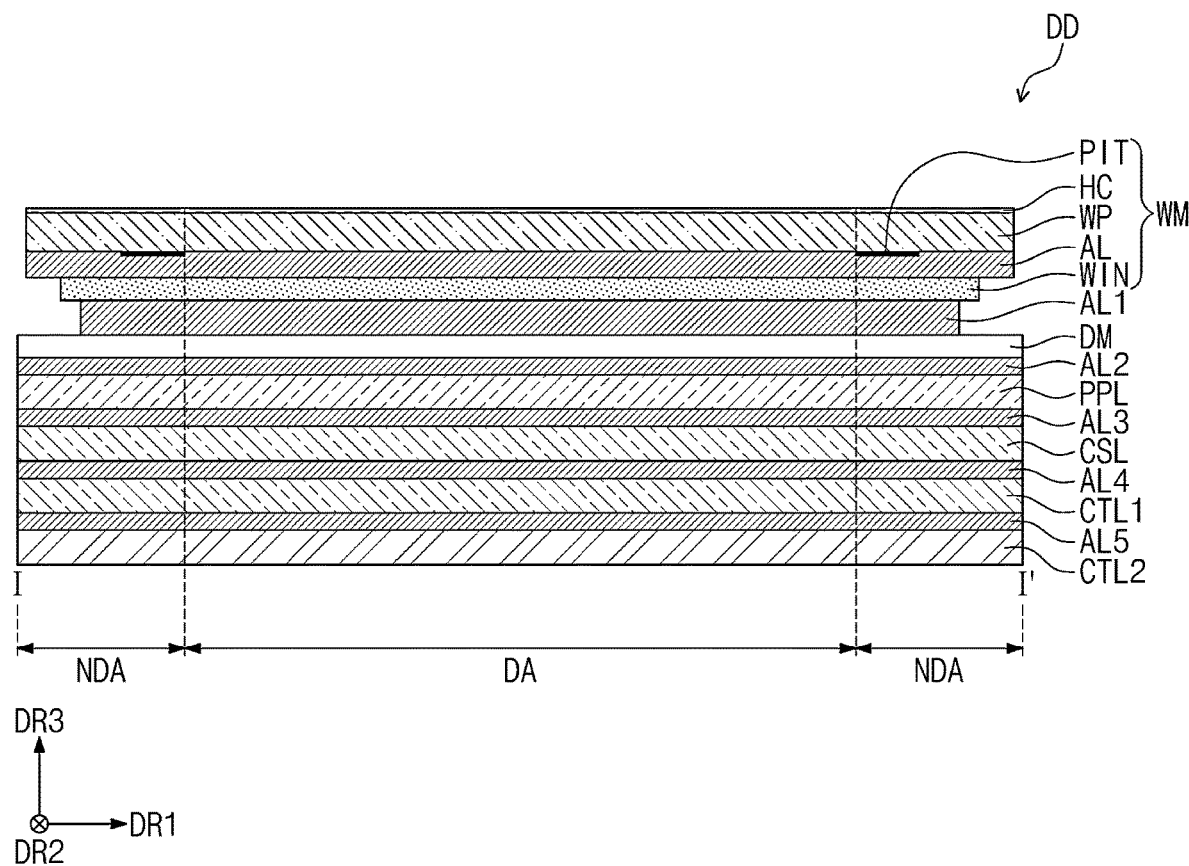
FIG. 3 is a cross-sectional view of a display device according to an embodiment of the inventive concept.

FIG. 3 is a cross-sectional view of a display device according to an embodiment of the inventive concept. FIG. 3 is a cross-sectional view of a display device corresponding to line I-I' shown in FIG. 2.

Referring to FIG. 3, the display device DD may include a window WM, a display module DM, a panel protection layer PPL, a cushion layer CSL, a first conductive sheet CTL1, a second conductive sheet CTL2, and first to fifth adhesive layers AL1 to AL5. The first to fifth adhesive layers AL1 to AL5 each bond two adjacently stacked components among the above components. The first to fifth adhesive layers AL1 to AL5 may include pressure sensitive adhesive (PSA) or optically clear adhesive (OCA), but the type of adhesive layers is not necessarily limited thereto.

The window WM provides an outer surface of the display device DD. The window WM may include a base layer BS, a window protection layer WP, a hard coating layer HC, and a print layer PIT, or a black matrix layer. The base layer BS may have optically transparent properties. The base layer BS may include glass or synthetic resin films. The window protection layer WP is bonded to the base layer BS through an adhesive layer AL. The window protection layer WP may include a flexible plastic material such as polyimide or polyethylene terephthalate. The hard coating layer HC may be disposed on an upper surface of the window protection layer WP.

A print layer PIT may be disposed on a lower surface of the window protection layer WP. The print layer PIT may be a black matrix layer. The print layer PIT may be black, but the color of the print layer PIT is not necessarily limited thereto. The print layer PIT may be adjacent to the edge of the window protection layer WP. The print layer PIT may overlap the non-display region NDA. However, the stack structure of the window WM is not necessarily limited to the above-described structure.

The panel protection layer PPL may be disposed below the display module DM. The panel protection layer PPL may protect a lower portion of the display module DM. The panel protection layer PPL may include a flexible plastic material. For example, the panel protection layer PPL may include polyethylene terephthalate (PET). In an embodiment of the inventive concept, panel protection layer PPL might not be provided.

The cushion layer CSL is disposed below the panel protection layer PPL. The cushion layer CSL absorbs external shocks. The cushion layer CSL may include foamed plastic. In an embodiment of the inventive concept, the cushion layer CSL might not be provided.

The first conductive sheet CTL1 may be disposed below the cushion layer CSL. The first conductive sheet CTL1 may include a material having high magnetic permeability. The first conductive sheet CTL1 may include a ferromagnetic substance. For example, the first conductive sheet CTL1 may include a magnetic metal powder layer. The magnetic metal powder layer may include a base resin and magnetic metal powder mixed with the base resin. In an embodiment of the inventive concept, the first conductive sheet CTL1 might not be provided.

The second conductive sheet CTL2 may be disposed below the first conductive sheet CTL1. The second conductive sheet CTL2 may block electromagnetic waves generated from the electronic module EM of FIG. 2 to prevent the electromagnetic waves from interfering with the display module DM. The second conductive sheet CTL2 may include a diamagnetic substance. In addition, the second conductive sheet CTL2 may dissipate heat generated from the display module DM like the driving chip DIC (see FIG. 2).

The second conductive sheet CTL2 may include a metal layer such as copper, aluminum, gold, or titanium. The second conductive sheet CTL2 may include a metal oxide layer such as ITO or IZO. The second conductive sheet CTL2 may include carbon nanotubes, conductive polymer-coated carbon nanotubes, or graphite.

Figure 4:
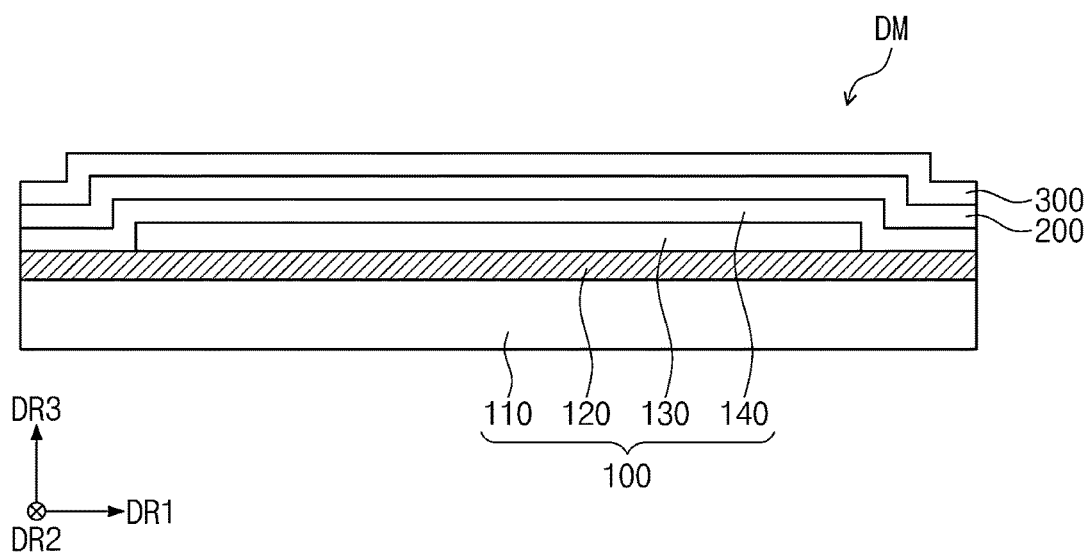
FIG. 4 is a cross-sectional view of a display module according to an embodiment of the inventive concept.

FIG. 4 is a cross-sectional view of a display module DM according to an embodiment of the inventive concept. Referring to FIG. 4, the display module DM may include a display panel 100, an input sensor 200, and an anti-reflector 300.

The display panel 100 may include a base layer 110, a driving element layer 120, a light emitting element layer 130, and an encapsulation layer 140. The base layer 110 may provide a base surface on which the driving element layer 120 is disposed.

The base layer 110 may be a rigid substrate, or a flexible substrate that is bendable, foldable, or rollable.

The base layer 110 has a multi-layer structure. The base layer 110 of an embodiment includes a plurality of resin layers. The base layer 110 may include a plurality of resin layers and a single- or multi-layer inorganic layer disposed between the plurality of resin layers. A specific structure of the base layer 110 will be described later.

The driving element layer 120 may be disposed on the base layer 110. The driving element layer 120 may include an insulating layer, a semiconductor pattern, a conductive pattern, and a signal line. The driving element layer 120 includes the driving circuit of the pixel PX described with reference to FIG. 2. The light emitting element layer 130 may be disposed on the driving element layer 120. The light emitting element layer 130 may include a light emitting element of the pixel PX described in FIG. 2.

The encapsulation layer 140 may be disposed on the light emitting element layer 130. The encapsulation layer TFE may protect the light emitting element layer 130 from moisture, oxygen, and foreign substances such as dust particles. The encapsulation layer 140 may include at least one inorganic layer. The encapsulation layer 140 may include a lamination structure of an inorganic layer/an organic layer/an inorganic layer.

The input sensor 200 may be disposed on the display panel 100. The input sensor 200 may detect inputs from the stylus pen STP and inputs from the body part (e.g., finger) of a user FG shown in FIG. 1A. The input sensor 200 may be formed on the display panel 100 through a roll-to-roll process. In this case, the input sensor 200 may be directly disposed on the display panel 100. The input sensor IS may be directly disposed on the encapsulation layer 140. As used herein, "a component B is directly disposed on a component A" indicates that an adhesive layer is not disposed between the component A and the component B.

The anti-reflector 300 may be disposed on the input sensor 200. The anti-reflector 300 may reduce reflectivity of external light. The anti-reflector 300 may be directly disposed on the input sensor 200 through a roll-to-roll process.

The anti-reflector 300 may include a color filter. The color filter has a color corresponding to the color of source light. For example, a red color filter is disposed on a light emitting element that generates red light. The anti-reflector 300 may further include a light blocking pattern disposed between color filters.

Figure 5:
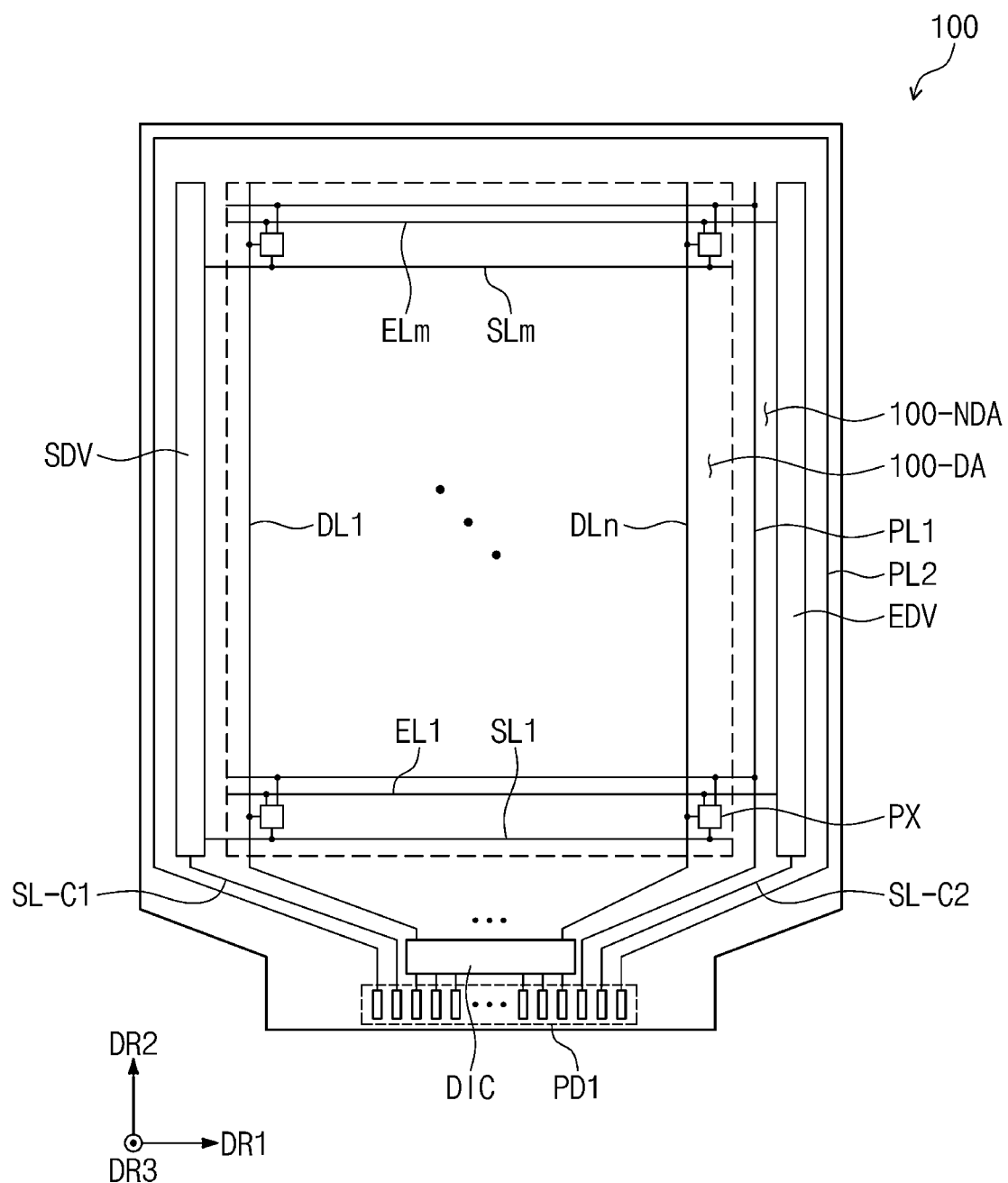
FIG. 5 is a plan view of a display panel according to an embodiment of the inventive concept.

FIG. 5 is a plan view of the display panel 100 according to an embodiment of the inventive concept.

Referring to FIG. 5, the display panel 100 may include a plurality of pixel PX, a scan driving circuit SDV, a light emitting driving circuit EDV, a plurality of signal lines, and a plurality of first pads PD1. The driving chip DIC mounted in the non-display region 100-NDA may include a data driving circuit. In an embodiment of the inventive concept, the data driving circuit, like the scan driving circuit SDV and the light emitting driving circuit EDV, may also be integrated into the display panel 100.

The plurality of signal lines may include a plurality of scan lines SL1 to SLm, a plurality of data lines DL1 to DLn, a plurality of light emitting lines EL1 to ELm, first and second control lines SL-C1 and SL-C2, and first and second power lines PL1 and PL2. Here, m and n are each integers of 2 or greater.

The scan lines SL1 to SLm may extend in the second direction DR2 and be connected to the pixels PX and the scan driving circuit SDV. The data lines DL1 to DLn may extend in the first direction DR1 and be connected to the pixels PX and the data driving chip DIC. The light emitting lines EL1 to ELm may extend in the second direction DR2 and be connected to the pixels PX and the light emitting driving circuit EDV.

The first power line PL1 receives a first power voltage, and the second power line PL2 receives a second power voltage at a lower level than the first power voltage. A second electrode (i.e., cathode) of a light emitting element is connected to the second power line PL2.

The first control line SL-C1 may be connected to the scan driving circuit SDV and may extend toward a lower end of the display panel 100. The second control line SL-C2 may be connected to the light emitting driving circuit EDV and may extend toward a lower end of the display panel 100. The first pads PD1 may be disposed in the non-display region 100-NDA adjacent to the lower end of the display panel 100 and may be closer to the lower end of the display panel 100 than the driving chip DIC. The first pads PD1 may be connected to the driving chip DIC and to some of the signal lines.

The scan driving circuit SDV may generate a plurality of scan signals, and the scan signals may be applied to the pixels PX through the scan lines SL1 to SLm. The driving chip DIC may generate a plurality of data voltages, and the data voltages may be applied to the pixels PX through the data lines DL1 to DLn. The light emitting driving circuit EDV may generate a plurality of light emitting signals, and the light emitting signals may be applied to the pixels PX through the light emitting lines EL1 to ELm.

The pixels PX may be provided with the data voltages in response to the scan signals. The pixels PX may display images by emitting light of luminance corresponding to the data voltages in response to the light emitting signals.

Figure 6:
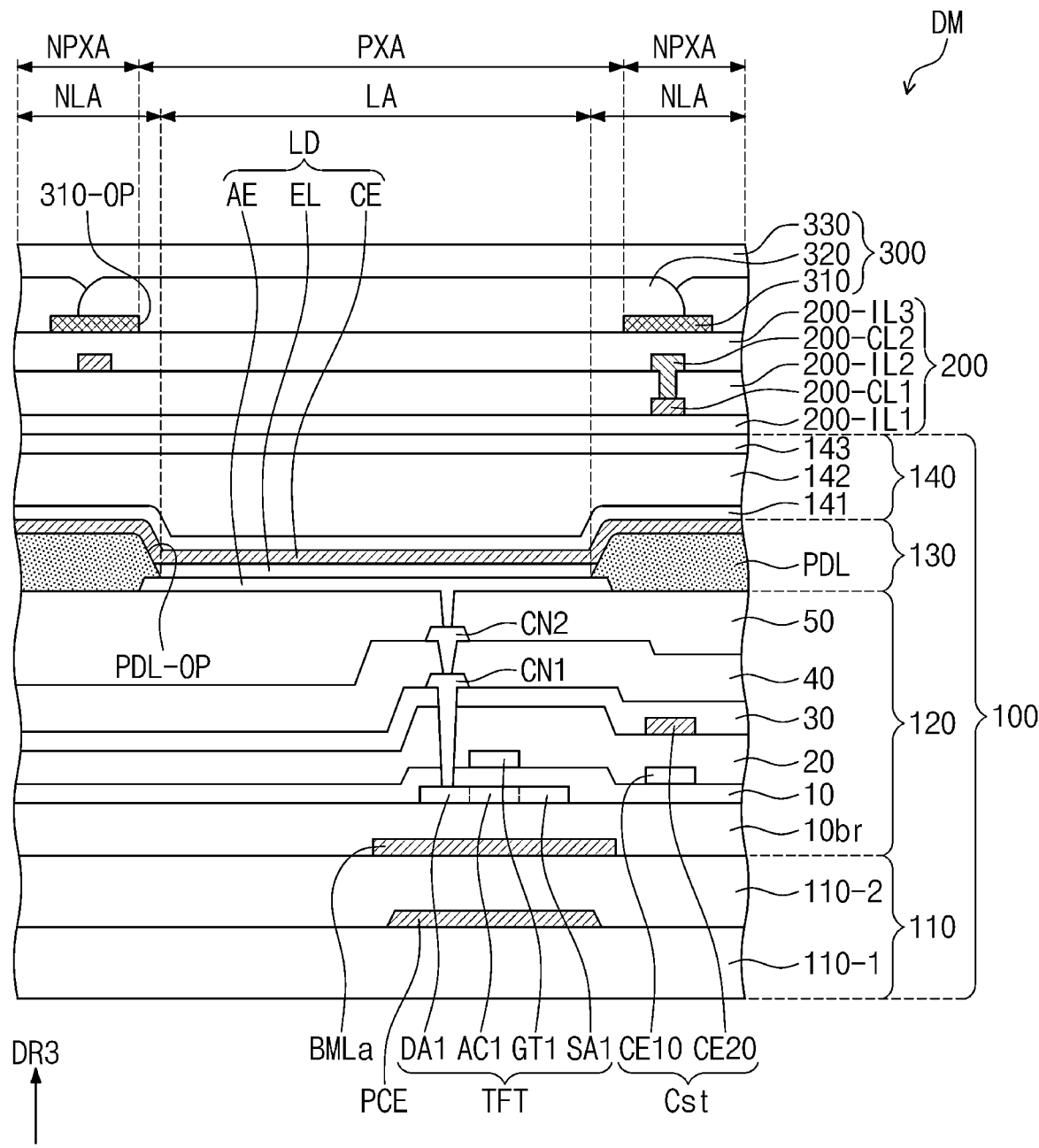
FIG. 6 is a cross-sectional view enlarging a display module according to an embodiment of the inventive concept.

FIG. 6 is a cross-sectional view enlarging the display module DM according to an embodiment of the inventive concept.

FIG. 6 shows a cross-section corresponding to one light emitting region LA and a surrounding non-light emitting region NLA. FIG. 6 shows a cross-section of a light emitting element LD included in one pixel PX, and a transistor TFT connected thereto. The transistor may be one of a plurality of transistors included in a driving circuit of the pixel PX. In the present embodiment, the transistor TFT is described as a silicon transistor, but may alternatively be a metal oxide transistor.

The base layer 110 has a multi-layer structure. The base layer 110 of an embodiment includes a plurality of resin layers. The base layer 110 may include a plurality of resin layers and a single- or multi-layer inorganic layer disposed between the plurality of resin layers.

The base layer 110 may include a first resin layer 110-1 and a second resin layer 110-2. The second resin layer 110-2 may be disposed on the first resin layer 110-1. The first resin layer 110-1 and the second resin layer 110-2 may each include a polymer resin. The first resin layer 110-1 and the second resin layer 110-2 may each include, for example, an acryl-based resin, a methacryl-based resin, a polyisoprene-based resin, a vinyl-based resin, an epoxy-based resin, a urethane-based resin, or a cellulose-based resin, a siloxane-based resin, a polyimide-based resin, a polyamide-based resin, and a perylene-based resin. The first resin layer 110-1 and the second resin layer 110-2 may each include polyimide.

The base layer 110 may further include a single-layer or multi-layer inorganic layer disposed between the first resin layer 110-1 and the second resin layer 110-2. The inorganic layer may include, for example, silicon oxide, silicon nitride, or silicon oxy nitride.

The display panel 100 of an embodiment includes a charge electrode PCE. The charge electrode PCE is disposed below at least one of the plurality of resin layers 110-1 and 110-2 included in the base layer 110. As shown in FIG. 6, the charge electrode PCE may be disposed below the second resin layer 110-2. The charge electrode PCE may be disposed on the first resin layer 110-1 and may be covered by the second resin layer 110-2. For example, when the base layer 110 includes a single-layer or multi-layer inorganic layer disposed between the first resin layer 110-1 and the second resin layer 110-2, the charge electrode PCE may be disposed on the inorganic layer.

The charge electrode PCE charges the resonance circuit of the stylus pen STP (see FIG. 1A) over a charging section. The charge electrode PCE may form a coil-shaped current path through an externally applied constant voltage, and thus generate a magnetic field, and accordingly, the resonance circuit of the stylus pen STP (see FIG. 1A) may be charged by receiving the generated magnetic field. This will be described in greater detail later.

Referring to FIGS. 5 and 6 together, the charge electrode PCE overlaps the display region 100-DA, when viewed on a plane. The charge electrode PCE may overlap the pixels PX disposed in the display region 100-DA, when viewed on a plane. At least a portion of the charge electrode PCE may overlap the light emitting element LD, when viewed on a plane. For example, at least a portion of the charge electrode PCE may overlap the light emitting region LA. The charge electrode PCE is disposed below the driving element layer 120 and the light emitting element layer 130, and may thus not affect degradation in luminous efficiency of the light emitting element LD even when overlapping the light emitting region LA, unlike the conductive pattern layers 200-CL1 and 200-CL2 of the input sensor 200, which will be described later.

The charge electrode PCE may have a single-layer structure or a structure of multiple layers stacked along the third direction DR3. The multi-layer conductive pattern may include at least one metal layer. The multi-layer conductive pattern may further include a transparent conductive layer. The multi-layer conductive pattern may include metal layers including different metals. Each of the transparent conductive layers may include indium tin oxide (ITO), indium zinc oxide (IZO), zinc oxide (ZnO), indium tin zinc oxide (ITZO), PEDOT, a metal nano wire, and graphene. Each of the metal layers may include molybdenum, silver, titanium, copper, aluminum, and an alloy thereof.

The charge electrode PCE may have a thickness of about 0.1 μm to about 1 μm. When the thickness of the charge electrode PCE is less than 0.1 μm, line resistance may increase and thus the stylus pen STP (see FIG. 1A) may have reduced charging efficiency. When the thickness of the charge electrode PCE is greater than 1 μm, the charge electrode PCE and the base layer 110 on which the charge electrode PCE is disposed may have excessively increased thickness to increase a total thickness of the electronic device ED (see FIG. 1A) and deteriorate folding characteristics.

A buffer layer 10br may be disposed on the base layer 110. The buffer layer 10br may prevent diffusion of metal atoms or impurities from the base layer 110 into an upper semiconductor pattern. The semiconductor pattern includes an active region AC1 of the transistor TFT.

A shielding pattern BMLa may be disposed below the transistor TFT. The shielding pattern BMLa may block external light from reaching the transistor TFT. The shielding pattern BMLa may be disposed between the base layer 110 and the buffer layer 10br. In an embodiment of the inventive concept, a barrier layer of an inorganic layer may be further disposed between the shielding pattern BMLa and the buffer layer 10br. The shielding pattern BMLa may be connected to electrodes or lines, and may receive constant voltages or signals therefrom.

The shielding pattern BMLa may overlap the charge electrode PCE, when viewed on a plane. The shielding pattern BMLa may be disposed on the second resin layer 110-2 and may entirely overlap the charge electrode PCE when viewed on a plane. For example, the shielding pattern BMLa may cover an upper portion of the charge electrode PCE. However, the embodiment of the inventive concept is not necessarily limited thereto, and the shielding pattern BMLa may overlap only a portion of the charge electrode PCE. The shielding pattern BMLa may be disposed above the charge electrode PCE, and may thus prevent parasitic capacitance generated by the charge electrode PCE from deteriorating the characteristics of semiconductor patterns, conductive patterns, and signal lines included in the driving element layer 120.

The semiconductor pattern may be disposed on the buffer layer 10br. The semiconductor pattern may include a silicon semiconductor. For example, the silicon semiconductor may include amorphous silicon, polycrystalline silicon, or the like. For example, the semiconductor pattern may include low-temperature polysilicon.

The semiconductor pattern may include a first region having higher conductivity and a second region having lower conductivity. The first region may be doped with an N-type dopant or a P-type dopant. A P-type transistor may include a doped region doped with the P-type dopant, and a N-type transistor may include a doped region doped with the N-type dopant. The second region may be a non-doped region or may be doped in a lower concentration than the first region.

The first region has greater conductivity than the second region, and may substantially serve as an electrode or a signal line. The second region may substantially correspond to an active region (or a channel) of the transistor. For example, a portion of the semiconductor pattern may be an active region of the transistor, another portion may be a source or drain of the transistor, and the other portion may be a connection electrode or a connection signal line.

A source region SA1 (or a source), an active region AC1 (or a channel), and a drain region DA1 (or a drain) of the transistor TFT may be formed from the semiconductor pattern. The source region SA1 and the drain region DA1 may extend in opposite directions from the active region AC1 in a cross-section.

A first insulating layer 10 may be disposed on the buffer layer 10br. The first insulating layer 10 may commonly overlap a plurality of pixels PX (see FIG. 1) and may cover the semiconductor pattern. The first insulating layer 10 may include an inorganic layer and/or an organic layer, and have a single-layered or multi-layered structure. The inorganic layer may include aluminum oxide, titanium oxide, silicon oxide, silicon nitride, silicon oxynitride, zirconium oxide, and/or hafnium oxide. In the present embodiment, the first insulating layer 10 may be a single-layered silicon oxide layer. Insulating layers of the driving element layer 120 which will be described later in addition to the first insulating layer 10 may be inorganic layers and/or organic layers, and have single-layer or multi-layer structures. The inorganic layer may include at least one of the materials described above, but is not necessarily limited thereto.

A gate GT1 of the transistor TFT is disposed on the first insulating layer 10. The gate GT1 may be a portion of a metal pattern. The gate GT1 overlaps the active region AC1. In the process of doping the semiconductor pattern, the gate GT1 may function as a mask. The gate GT1 may include titanium (Ti), silver (Ag), silver-containing alloy, molybdenum (Mo), molybdenum-containing alloy, aluminum AL, aluminum-containing alloy, aluminum nitride (AlN), tungsten (W), tungsten nitride (WN), copper (Cu), indium tin oxide (ITO), indium zinc oxide (IZO), and the like, but is not necessarily particularly limited thereto.

A second insulating layer 20 may be disposed on the first insulating layer 10 and may cover the gate GT1. A third insulating layer 30 may be disposed on the second insulating layer 20. A second electrode CE20 of the storage capacitor Cst may be disposed between the second insulating layer 20 and the third insulating layer 30. In addition, a first electrode CE10 of the storage capacitor Cst may be disposed between the first insulating layer 10 and the second insulating layer 20.

A first connection electrode CN1 may be disposed on the third insulating layer 30. The first connection electrode CN1 may be connected to drain region DA1 of the transistor TFT through a contact hole passing through the first to third insulating layers 10, 20, and 30.

A fourth insulating layer 40 may be disposed on the third insulating layer 30. A second connection electrode CN2 may be disposed on the fourth insulating layer 40. The second electrode CN2 may be connected to the first connection electrode CN1 through a contact hole passing through the fourth insulating layer 40. A fifth insulating layer 50 may be disposed on the fourth insulating layer 40 and may cover the second connection electrode CN2. A stack structure of the first insulating layer 10 to the fifth insulating layer 50 is only presented as an example, and additional conductive layers and insulating layers may be further disposed in addition to the first insulating layer 10 to the fifth insulating layer 50.

Each of the fourth insulating layer 40 and the fifth insulating layer 50 may be an organic layer. For example, the organic layer may include general polymers (such as benzocyclobutene (BCB), polyimide, hexamethyldisiloxane (HMDSO), polymethylmethacrylate (PMMA), or polystyrene (PS)), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light emitting element LD may include a first electrode AE (or a pixel electrode), an emission layer EL, and a second electrode CE (or a common electrode). The first electrode AE may be disposed on the fifth insulating layer 50. The first electrode AE may be a (semi) light-transmitting electrode or a reflective electrode. The first electrode AE may include a reflective layer formed of Ag, Mg, Cu, Al, Pt, Pd, Au, Ni, Nd, Ir, Cr, Li, Ca, LiF/Ca, LiF/Al, Mo, Ti, Yb, W, or a compound or a mixture thereof (e.g., AgMg, AgYb, or MgYb), and a transparent or semi-transparent electrode layer formed on the reflective layer. The transparent or semi-transparent electrode may include indium tin oxide (ITO), indium zinc oxide (IZO), indium gallium zinc oxide (IGZO), zinc oxide (ZnO) or indium oxide ($In_2O_3$), and/or aluminum-doped zinc oxide (AZO). For example, the first electrode AE may include a stack structure of ITO/Ag/ITO.

The pixel defining film PDL may be disposed on the fifth insulating layer 50. According to an embodiment, the pixel defining film PDL may have light absorption properties, and for example, the pixel defining film PDL may be black in color. The pixel defining film PDL may include a black coloring agent. The black coloring agent may include a black dye and a black pigment. The black coloring agent may include carbon black, a metal such as chromium, or an oxide thereof. The pixel defining film PDL may correspond to a light blocking pattern having light blocking properties.

The pixel defining film PDL may cover a portion of the first electrode AE (e.g., anode). For example, an opening PDL-OP exposing a portion of the first electrode AE may be defined in the pixel defining film PDL. The opening PDL-OP of the pixel defining film PDL may define the light emitting region LA.

The pixel defining film PDL may increase the distance between an edge of the first electrode AE and the second electrode CE (e.g., cathode). Accordingly, the pixel defining film PDL may serve to prevent an arc from being caused at the edge of the first electrode AE.

A hole control layer may be disposed between the first electrode AE and the emission layer EL. The hole control layer may include a hole transport layer, and may further include a hole injection layer. An electron control layer may be disposed between the emission layer EL and the second electrode CE. The electron control layer may include an electron transport layer, and may further include an electron injection layer.

The encapsulation layer 140 may be disposed on the light emitting element layer 130. The encapsulation layer 140 may include an inorganic layer 141, an organic layer 142, and an inorganic layer 143 which are sequentially stacked, but the layers forming the encapsulation layer 140 are not necessarily limited thereto.

The inorganic layers 141 and 143 may protect the light emitting element layer 130 from moisture and oxygen, and the organic layer 142 may protect the light emitting element layer 130 from foreign substances such as dust particles. The inorganic layers 141 and 143 may include a silicon nitride layer, a silicon oxy nitride layer, a silicon oxide layer, a titanium oxide layer, or an aluminum oxide layer. The organic layer 142 may include an acryl-based organic layer, but the embodiment of the inventive concept is not necessarily limited thereto.

The input sensor 200 may be disposed on the display panel 100. The input sensor 200 may include a first insulating layer 200-IL1, a first conductive pattern layer 200-CL1, a second insulating layer 200-IL2, a second conductive pattern layer 200-CL2, and a third insulating layer 200-IL3. The first insulating layer 200-IL1 may be directly disposed on the encapsulation layer 140.

In an embodiment of the inventive concept, the first insulating layer 200-IL1 and each of the second insulating layer 200-IL3 might not be provided. When the first insulating layer 200-IL1 is not provided, the first conductive pattern layer 200-CL1 may be disposed on an uppermost insulating layer of the encapsulation layer 140. The third insulating layer 200-IL3 may be replaced with an adhesive layer, or an insulating layer of the anti-reflector 300 disposed on the input sensor 200.

The first conductive pattern layer 200-CL1 may include first conductive patterns, and the second conductive pattern layer 200-CL2 may include second conductive patterns. The first conductive pattern 200-CL1 is disposed on the first insulating layer 200-IL1. The second conductive pattern 200-CL2 is disposed on the second insulating layer 200-IL2. Hereinafter, the first conductive pattern layer 200-CL1 and the first conductive patterns will be referred to by the same reference numeral, and the second conductive pattern layer 200-CL2 and the second conductive patterns will be referred to by the same reference number. For example, the first conductive patterns 200-CL1 and the second conductive patterns 200-CL2 may each correspond to a sensing electrode, which will be described later.

The first conductive layer 200-CL1 and the second conductive layer 200-CL2 may each have a structure of a single layer or a structure of multiple layers stacked along the third direction DR3. The multi-layer conductive pattern may include at least two or more layers of transparent conductive layers and metal layers. The multi-layer conductive pattern may include metal layers including different metals. Each of the transparent conductive layers may include indium tin oxide (ITO), indium zinc oxide (IZO), zinc oxide (ZnO), indium tin zinc oxide (ITZO), PEDOT, a metal nano wire, and graphene. Each of the metal layers may include molybdenum, silver, titanium, copper, aluminum, and an alloy thereof.

The first conductive patterns 200-CL1 and the second conductive patterns 200-CL2 may each have a thickness of about 0.1 µm to about 1 µm. When the thickness of each of the first conductive patterns 200-CL1 and the second conductive patterns 200-CL2 is less than 0.1 µm, line resistance may increase and the input sensor 200 may have reduced input detection performance. When the thickness of each of the first conductive patterns 200-CL1 and the second conductive patterns 200-CL2 is greater than 1 µm, the input sensor 200 may have excessively increased thickness to increase a total thickness of the electronic device ED (see FIG. 1A), and deteriorate folding characteristics.

In the present embodiment, the first insulating layer 200-IL1 to the third insulating layer 200-IL3 may include an inorganic layer or an organic layer. In the present embodiment, the first insulating layer 200-IL1 to the third insulating layer 200-IL3 may include an inorganic layer. The inorganic layer may include silicon oxide, silicon nitride, or silicon oxy nitride.

In an embodiment of the inventive concept, at least one of the first to third insulating layers 200-IL1 to 200-IL3 may be an organic layer. For example, the third insulating layer 200-IL3 may include an organic layer. The organic layer may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The anti-reflector 300 may be disposed on the input sensor 200. The anti-reflector 300 may include a light blocking pattern 310, a color filter 320, and a planarization layer 330. In an embodiment of the inventive concept, the light blocking pattern 310 might not be provided.

A material of the light blocking pattern 310 is not particularly limited to any specific substances as long as the material absorbs light. The light blocking pattern 310 is a layer which is black in color, and in an embodiment, the light blocking pattern 310 may include a black coloring agent. The black coloring agent may include a black dye and a black pigment. The black coloring agent may include carbon black, a metal such as chromium, or an oxide thereof.

The light blocking pattern 310 may overlap the first conductive patterns 200-CL1 and the second conductive patterns 200-CL2, when viewed on a plane. The light blocking pattern 310 may prevent reflection of external light by the first conductive pattern 200-CL1 and the second conductive pattern 200-CL2. An opening 310-OP may be defined in the light blocking pattern 310. The opening 310-OP of the light blocking pattern 310 may overlap the first electrode AE, and may have an area greater than that of the opening PDL-OP of the pixel defining film 70. The opening 310-OP of the light blocking pattern 310 may define a pixel region PXA. The pixel region PXA may be defined as a region in which light generated from the light emitting element LD is emitted to the outside. As the area of the pixel region PXA increases, the luminance of an image may increase.

The color filter 320 may overlap at least the pixel region PXA. The color filter 320 may further overlap a non-pixel region NPXA. A portion of the color filter 320 may be disposed on the light blocking pattern 310. The color filter 320 may transmit the light generated from the light emitting element LD and block some wavelength bands of external light. Accordingly, the color filter 320 may reduce the reflection of external light by the first electrode AE or the second electrode CE.

The planarization layer 330 may cover the light blocking pattern 310 and the color filter 320. The planarization layer 330 may include an organic material, and the planarization layer 330 may provide a flat upper surface.

Figure 7A:
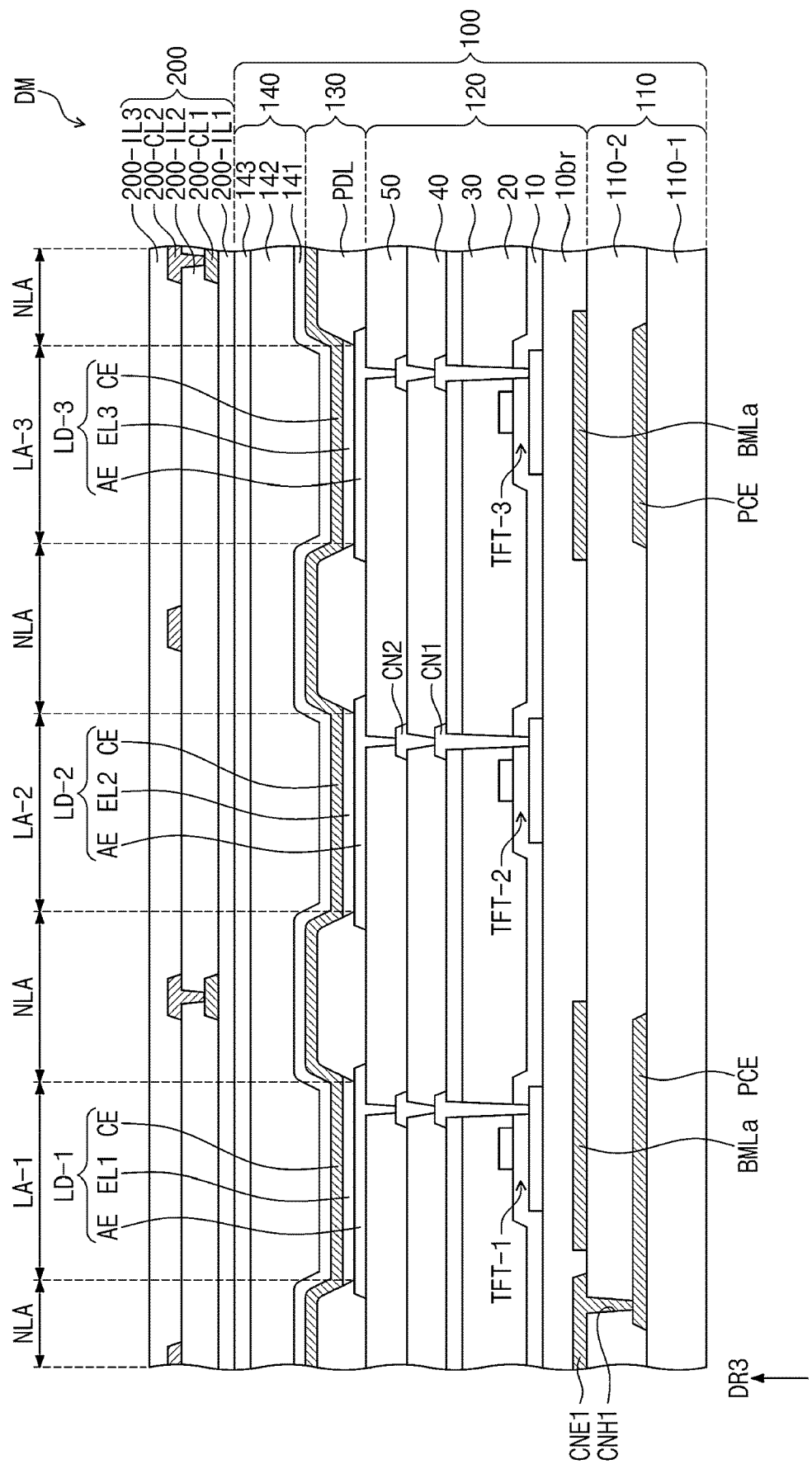
FIGS. 7A and 7B are each a cross-sectional view showing a portion of a display module according to an embodiment of the inventive concept.
Figure 7B:
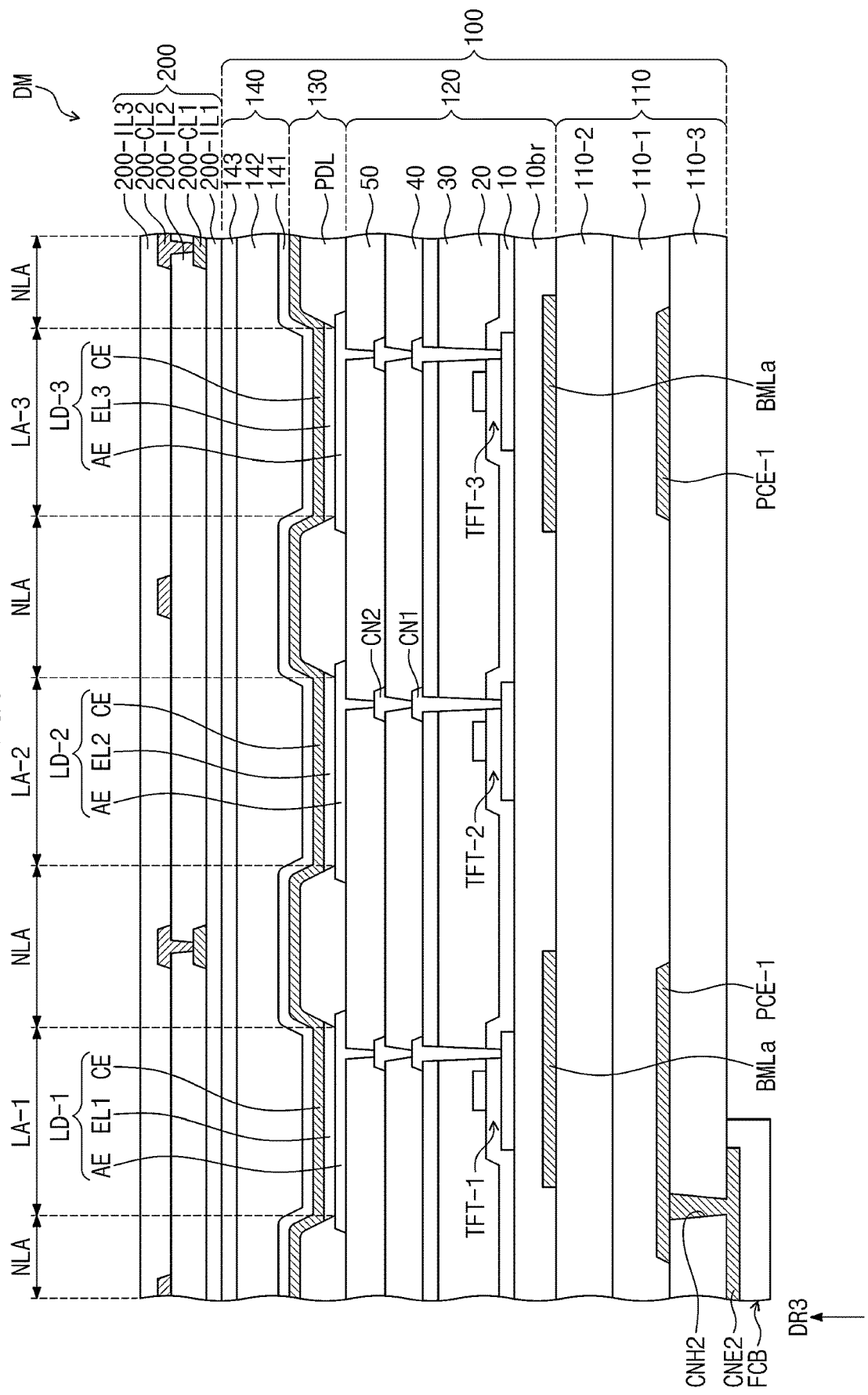

FIGS. 7A and 7B are each a cross-sectional view showing a portion of a display module DM according to an embodiment of the inventive concept. FIGS. 7A and 7B each show a cross-section of three light emitting elements LD and a transistor TFT connected thereto. For example, FIGS. 7A and 7B each show a stack structure of the display panel 100 and the input sensor 200 included in the display module DM, and the anti-reflector 300 (see FIG. 6) is not provided.

Referring to FIGS. 6 and 7A together, the display panel 100 may include a plurality of pixels, and the pixels may each include a plurality of light emitting elements LD-1, LD-2, and LD-3 disposed on the light emitting element layer 130, and transistors TFT-1, TFT-2, and TFT-3 connected to each of the light emitting elements LD-1, LD-2, and LD-3.

The display module DM may include a non-light emitting region NLA and light emitting regions LA-1, LA-2, and LA-3. The light emitting regions LA-1, LA-2, and LA-3 may each be a region emitting light generated from each of light emitting elements LD-1, LD-2, and LD-3. The light emitting regions LA-1, LA-2, and LA-3 may be spaced apart when viewed on a plane.

The light emitting regions LA-1, LA-2, and LA-3 may each be a region separated by the pixel defining film PDL. The non-light emitting region NLA may be a region between neighboring light emitting regions LA-1, LA-2, and LA-3 and may correspond to the pixel defining film PDL. The pixel defining film PDL may separate the light emitting elements LD-1, LD-2 and LD-3. Emission layers, EL1, EL2, and EL3 of the light emitting elements LD-1, LD-2, and LD-3 may be separated by being disposed in the opening PDL-OP defined in the pixel defining film PDL.

The light emitting regions LA-1, LA-2, and LA-3 may be divided into a plurality of groups according to color of light generated from the light emitting elements LD-1, LD-2, and LD-3. In the display device DD of an embodiment shown in FIGS. 7A and 7B, three light emitting regions LA-1, LA-2, and LA-3, which emit red light, green light, and blue light, are shown as an example. For example, the display device DD, according to an embodiment, may include a first light emitting region LA-1, a second light emitting region LA-2, and a third light emitting region LA-3, which are separated.

In the display device DD, according to an embodiment, the plurality of light emitting elements LD-1, LD-2, and LD-3 may emit light having different wavelength ranges. For example, in an embodiment, the display device DD may include a first light emitting element LD-1 emitting red light, a second light emitting element LD-2 emitting green light, and a third light emitting element LD-3 emitting blue light. For example, the first light emitting region LA-1, the second light emitting region LA-2, and the third light emitting region LA-3 of the display device DD may correspond to the first light emitting element LD-1, the second light emitting element LD-2, and the third light emitting element LD-3, respectively.

However, the embodiment of the inventive concept is not necessarily limited thereto, and the first to third light emitting elements LD-1, LD-2 and LD-3 may emit light in the same wavelength range or emit light in at least one different wavelength range. For example, the first to third light emitting elements LD-1, LD-2, and LD-3 all may emit blue light.

The first to third light emitting elements LD-1, LD-2, and LD-3 may each include a first electrode AE, emission layers EL1, EL2, and EL3, and a second electrode CE (or common electrode). The first electrode AE may be disposed on the fifth insulating layer 50. The first electrode AE may be a (semi) light-transmitting electrode or a reflective electrode. The first electrode AE1 may include a reflective layer formed of Ag, Mg, Al, Pt, Pd, Au, Ni, Nd, Ir, Cr, or a compound thereof, and a transparent or semi-transparent electrode layer formed on the reflective layer The transparent or semi-transparent electrode may include indium tin oxide (ITO), indium zinc oxide (IZO), indium gallium zinc oxide (IGZO), zinc oxide (ZnO) or indium oxide ($In_2O_3$), and/or aluminum-doped zinc oxide (AZO). For example, the first electrode AE may include a stack structure of ITO/Ag/ITO.

The emission layers EL1, EL2, and EL3 may have a single layer formed of a single material, a single layer formed of a plurality of different materials, or a multilayer structure having a plurality of layers formed of a plurality of different materials. The emission layers EL1, EL2, and EL3 may include known hosts and dopants for emitting light in the wavelength range described above.

The second electrode CE may be provided as a common layer, and may be a transflective electrode, or a transmissive electrode. The second electrode CE may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgYb).

The display panel 100 of an embodiment may include a charge electrode PCE, and the charge electrode PCE may overlap pixels. At least a portion of the charge electrode PCE may overlap at least a portion of the plurality of light emitting elements LD-1, LD-2, and LD-3, when viewed on a plane. For example, at least a portion of the charge electrode PCE may overlap at least a portion of the first light emitting region LA-1, the second light emitting region LA-2, and the third light emitting region LA-3. FIGS. 7A and 7B each show that the charge electrode PCE overlaps the first light emitting region LA-1 and the third light emitting region LA-3 as an example, but the embodiment of the inventive concept is not necessarily limited thereto, and the charge electrode PCE may overlap any one among the first light emitting region LA-1, the second light emitting region LA-2, and the third light emitting region LA-3, or may overlap each of the first light emitting region LA-1, the second light emitting region LA-2, and the third light emitting region LA-3.

The base layer 110 includes a plurality of resin layers, and the charge electrode PCE is disposed below at least one of the plurality of resin layers. As shown in FIG. 7A, the base layer 110 may include a first resin layer 110-1 and a second resin layer 110-2, and the charge electrode PCE may be disposed below the second resin layer 110-2. An upper surface of the charge electrode PCE may be covered by the second resin layer 110-2. For example, when the base layer 110 includes a single-layer or multi-layer inorganic layer disposed between the first resin layer 110-1 and the second resin layer 110-2, the charge electrode PCE may be disposed on the inorganic layer.

The charge electrode PCE may be disposed between a plurality of resin layers of the display panel 100 and spaced apart from the conductive pattern layers 200-CL1 and 200-CL2 included in the input sensor 200. The charge electrode PCE may be spaced apart from the conductive pattern layers 200-CL1 and 200-CL2 with a plurality of pixels disposed therebetween. The charge electrode PCE may be spaced apart from the conductive pattern layers 200-CL1 and 200-CL2 with the driving element layer 120 and the light emitting element layer 130 disposed therebetween. In the third direction DR3, the driving element layer 120, the light emitting element layer 130, and the encapsulation layer 140 may be disposed between the charge electrode PCE and the conductive pattern layers 200-CL1 and 200-CL2.

The shielding pattern BMLa may overlap the charge electrode PCE, when viewed on a plane. The shielding pattern BMLa may cover the upper portion of the charge electrode PCE.

The display panel 100 of an embodiment may further include a connection line CNE1 that is connected to the charge electrode PCE and applies a ground voltage to the charge electrode PCE. The connection line CNE1 may be connected to the charge electrode PCE through a resin layer disposed on the charge electrode PCE. In an embodiment, the connection line CNE1 may be connected to the charge electrode PCE through a contact hole CNH1 passing through the second resin layer 110-2.

The connection line CNE1 may be disposed on the same layer as the shielding pattern BMLa. The connection line CNE1 may be disposed on the second resin layer 110-2 in the same manner as the shielding pattern BMLa, and may include the same material as the shielding pattern BMLa. The connection line CNE1 may be formed through the same process as the shielding pattern BMLa. For example, a conductive layer formed on the second resin layer 110-2 may be patterned to form the connection line CNE1 and the shielding pattern BMLa.

For example, in FIGS. 6 and 7A, the base layer 110 is shown to have a structure in which two resin layers are stacked as an example, but the embodiment of the inventive concept is not necessarily limited thereto, and the base layer 110 may have a structure in which three or more resin layers are stacked.

Referring to FIG. 7B, the base layer 110 may include a first resin layer 110-1, a second resin layer 110-2, and a third resin layer 110-3. The second resin layer 110-2 may be disposed on the first resin layer 110-1, and the third resin layer 110-3 may be disposed below the first resin layer 110-1. The first resin layer 110-1, the second resin layer 110-2, and the third resin layer 110-3 may each include a polymer resin. The first resin layer 110-1, the second resin layer 110-2, and the third resin layer 110-3 may each include, for example, an acryl-based resin, a methacryl-based resin, a polyisoprene-based resin, a vinyl-based resin, an epoxy-based resin, a urethane-based resin, or a cellulose-based resin, a siloxane-based resin, a polyimide-based resin, a polyamide-based resin, and a perylene-based resin. The first resin layer 110-1, the second resin layer 110-2, and the third resin layer 110-3 may each include polyimide.

The base layer 110 may further include a single-layer inorganic layer or a multi-layer inorganic layer disposed between the first resin layer 110-1 and the second resin layer 110-2, and between the first resin layer 110-1 and the third resin layer 110-3. The inorganic layer may include, for example, silicon oxide, silicon nitride, or silicon oxy nitride.

A charge electrode PCE-1 is disposed below at least one of the plurality of resin layers. As shown in FIG. 7B, the charge electrode PCE-1 may be disposed below the first resin layer 110-1 and the second resin layer 110-2. The upper surface of the charge electrode PCE-1 may be covered by the first resin layer 110-1. For example, when the base layer 110 includes a single-layer or multi-layer inorganic layer disposed between the first resin layer 110-1 and the third resin layer 110-3, the charge electrode PCE-1 may be disposed on the inorganic layer.

The charge electrode PCE-1 may be electrically connected to the flexible circuit board FCB. The flexible circuit board FCB may be disposed below at least a portion of the display panel 100 and connected to the charge electrode PCE-1 to apply a ground voltage to the charge electrode PCE-1. In an embodiment, the charge electrode PCE-1 and the flexible printed circuit board FCB may be electrically connected through the resin layer disposed below the charge electrode PCE-1. In an embodiment, the charge electrode PCE may be connected to the flexible printed circuit board FCB through a contact hole CNH2 passing through the third resin layer 110-3. The charge electrode PCE-1 may be electrically connected to the connection line CNE2 included in the flexible printed circuit board FCB. For example, unlike what is shown in FIG. 7B, the charge electrode PCE-1 may be electrically connected to the flexible circuit board FCB through a separate additional connection line.

Figure 8:
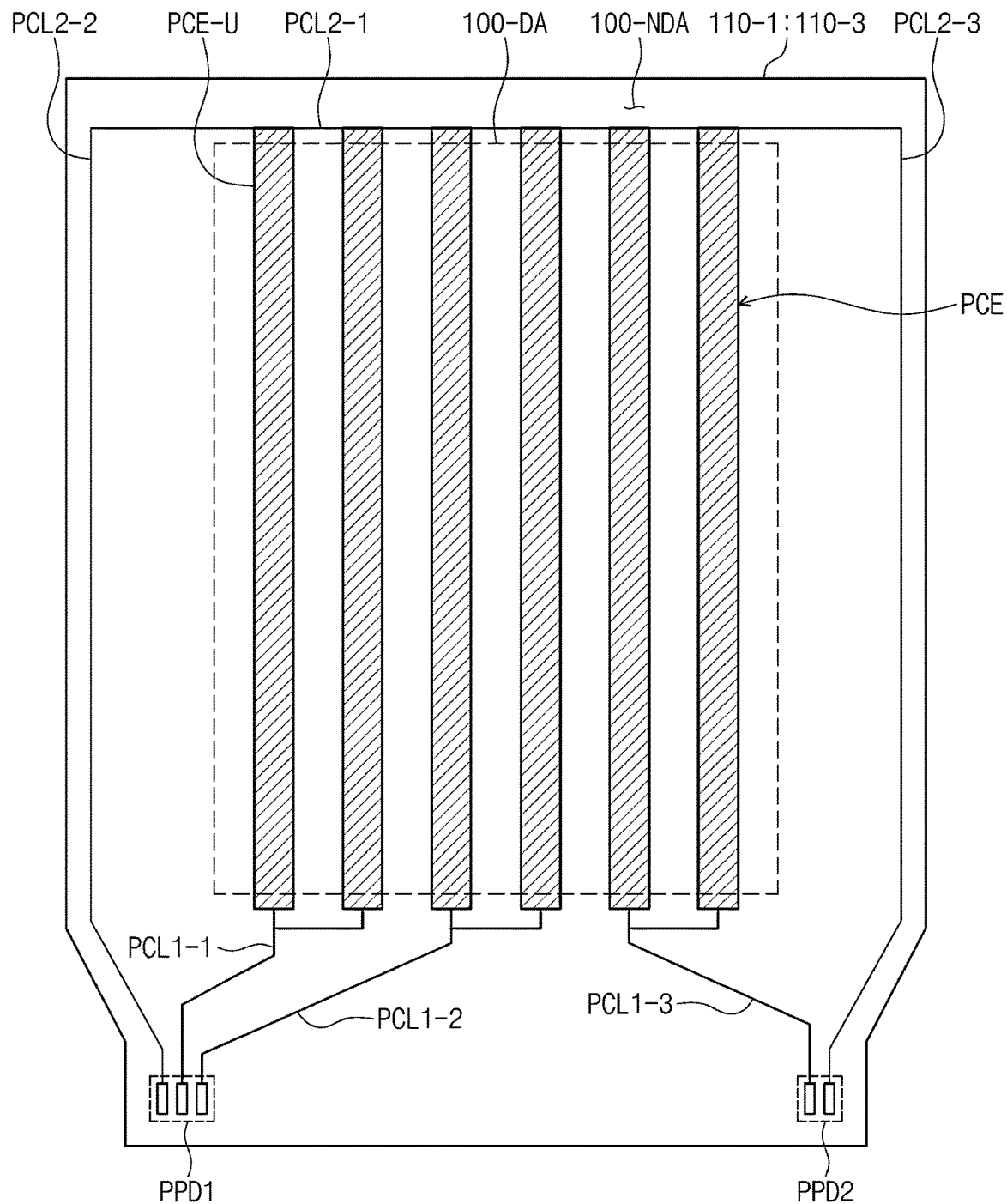
FIG. 8 is a plan view of charge electrodes included in a display device according to an embodiment of the inventive concept.
Figure 9A:
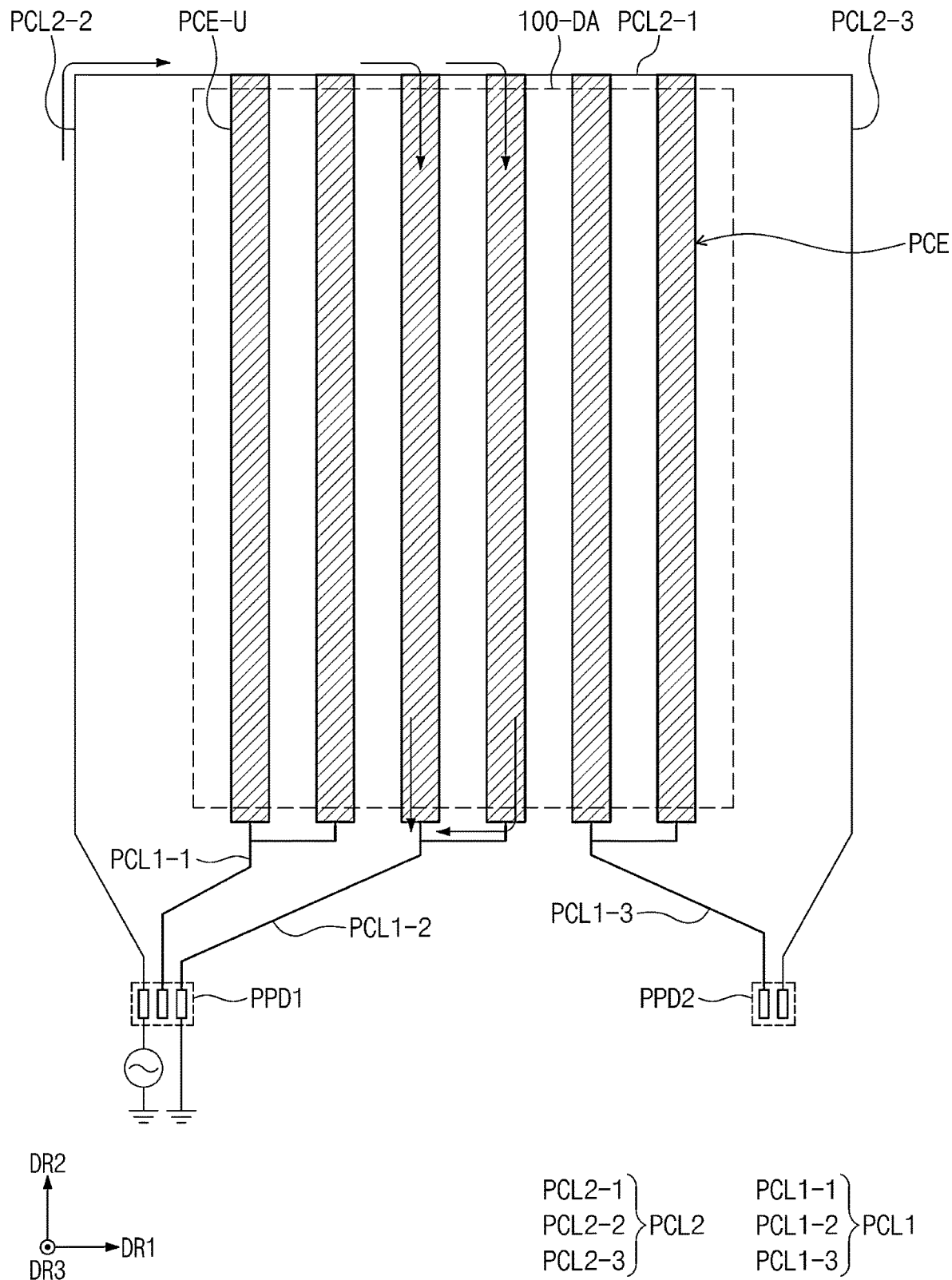
FIGS. 9A to 9C are plan views showing a charging section among operating sections of charge electrodes included in a display device according to an embodiment of the inventive concept.
Figure 9B:
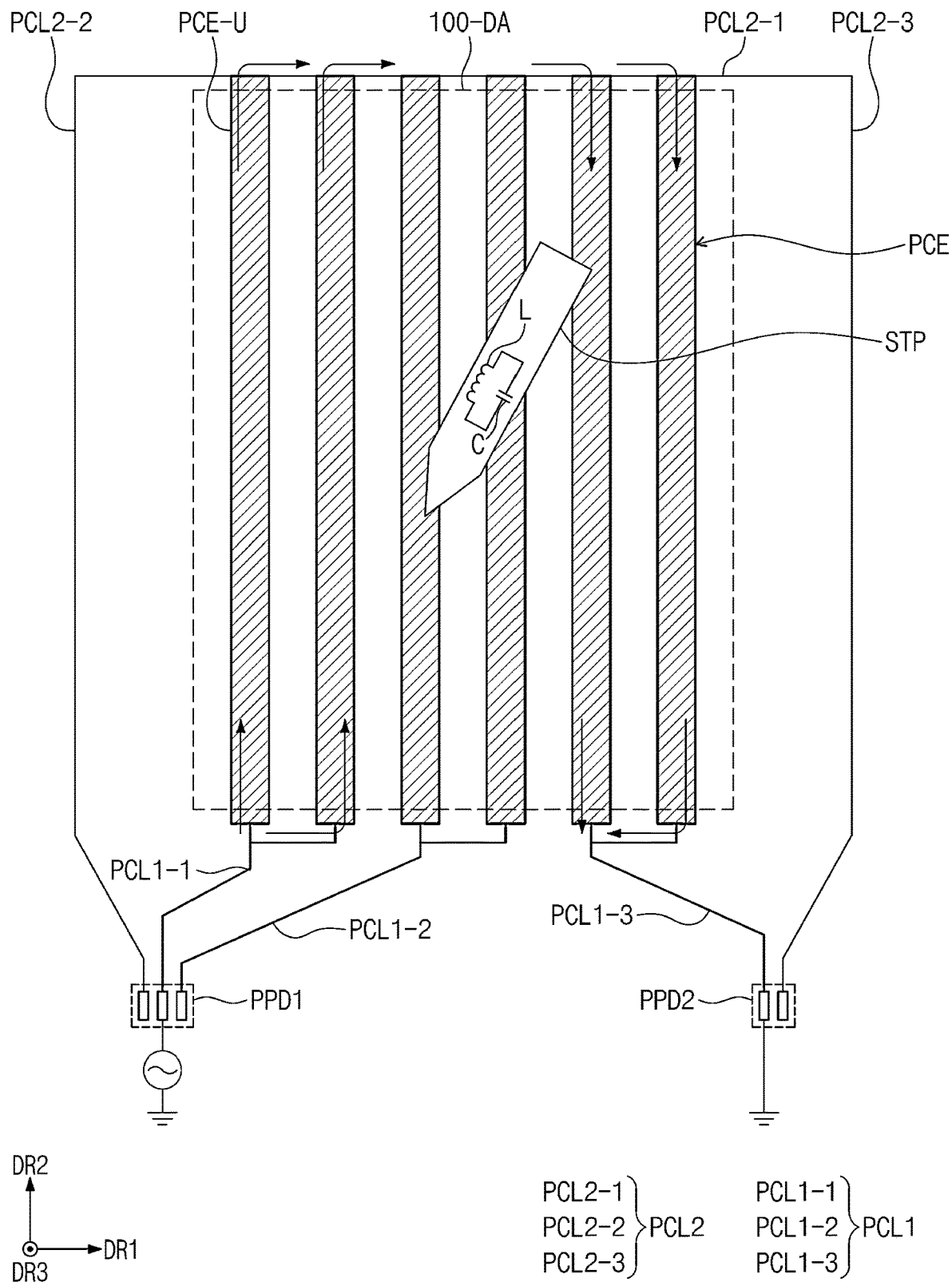
Figure 9C:
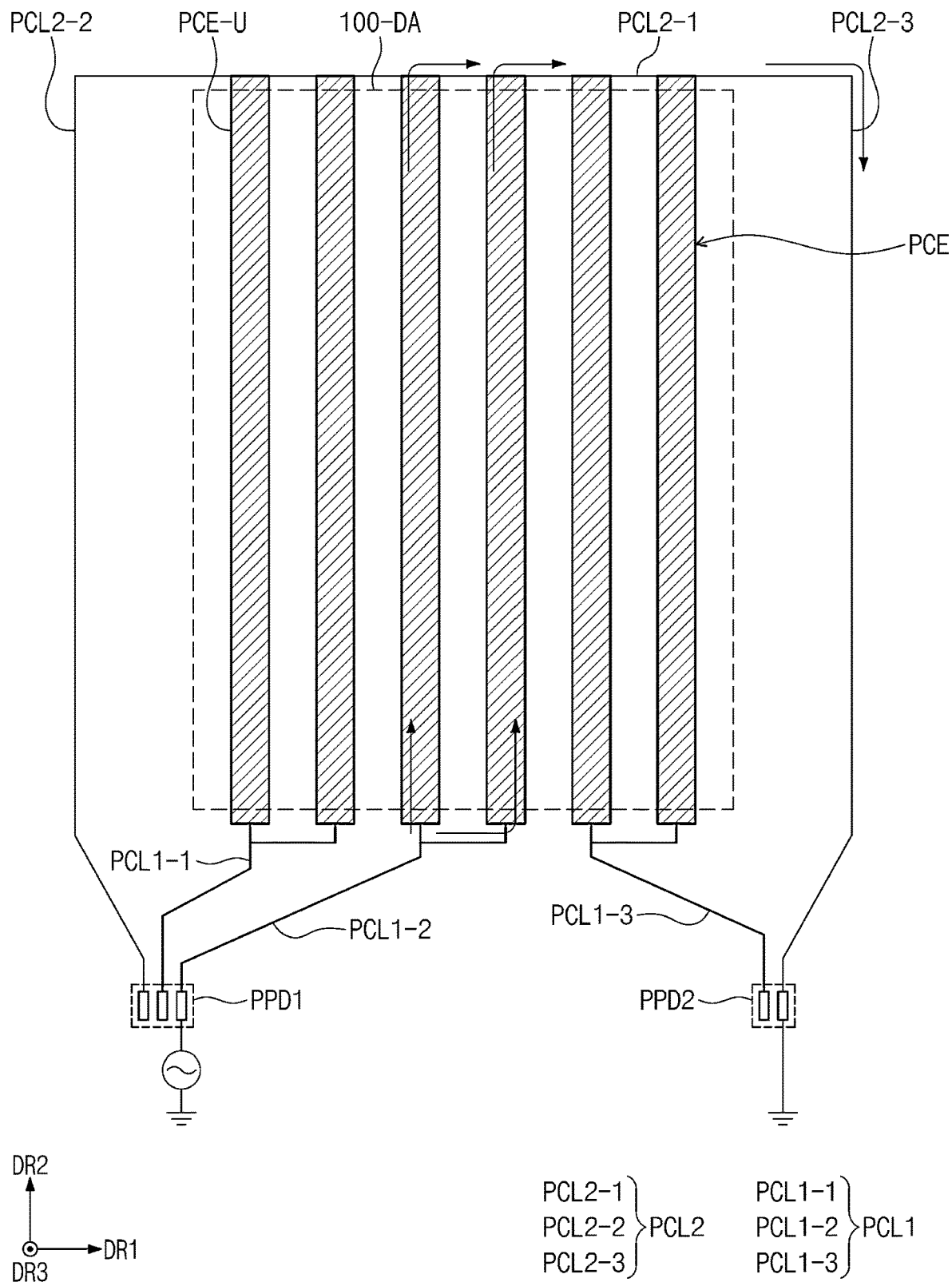

FIG. 8 is a plan view of charge electrodes included in a display panel according to an embodiment of the inventive concept. FIGS. 9A to 9C are plan views showing a charging section among operating sections of charge electrodes of FIG. 8.

Referring to FIGS. 6 to 8 together, the charge electrode PCE may be disposed below at least one of the plurality of resin layers 110-1 and 110-2 included in the base layer 110. The charge electrode PCE may be disposed on the first resin layer 110-1 and may be covered by the second resin layer 110-2, as shown in FIG. 7A. Alternatively, the charge electrode PCE may be disposed on the third resin layer 110-3 and covered by the first resin layer 110-1, as shown in FIG. 7B.

The charge electrode PCE may include a bar-type electrode extending in one direction. The charge electrode PCE may extend along the second direction DR2 and include a plurality of unit charge electrodes PCE-U spaced apart along the first direction DR1. In FIG. 8, for example, the charge electrode PCE is shown as an example including six bar-type unit charge electrodes PCE-U, but the embodiment of the inventive concept is not necessarily limited thereto, and the number of unit charge electrodes PCE-U may be provided in various ways depending on the type and size of an electronic device.

Figure 10:
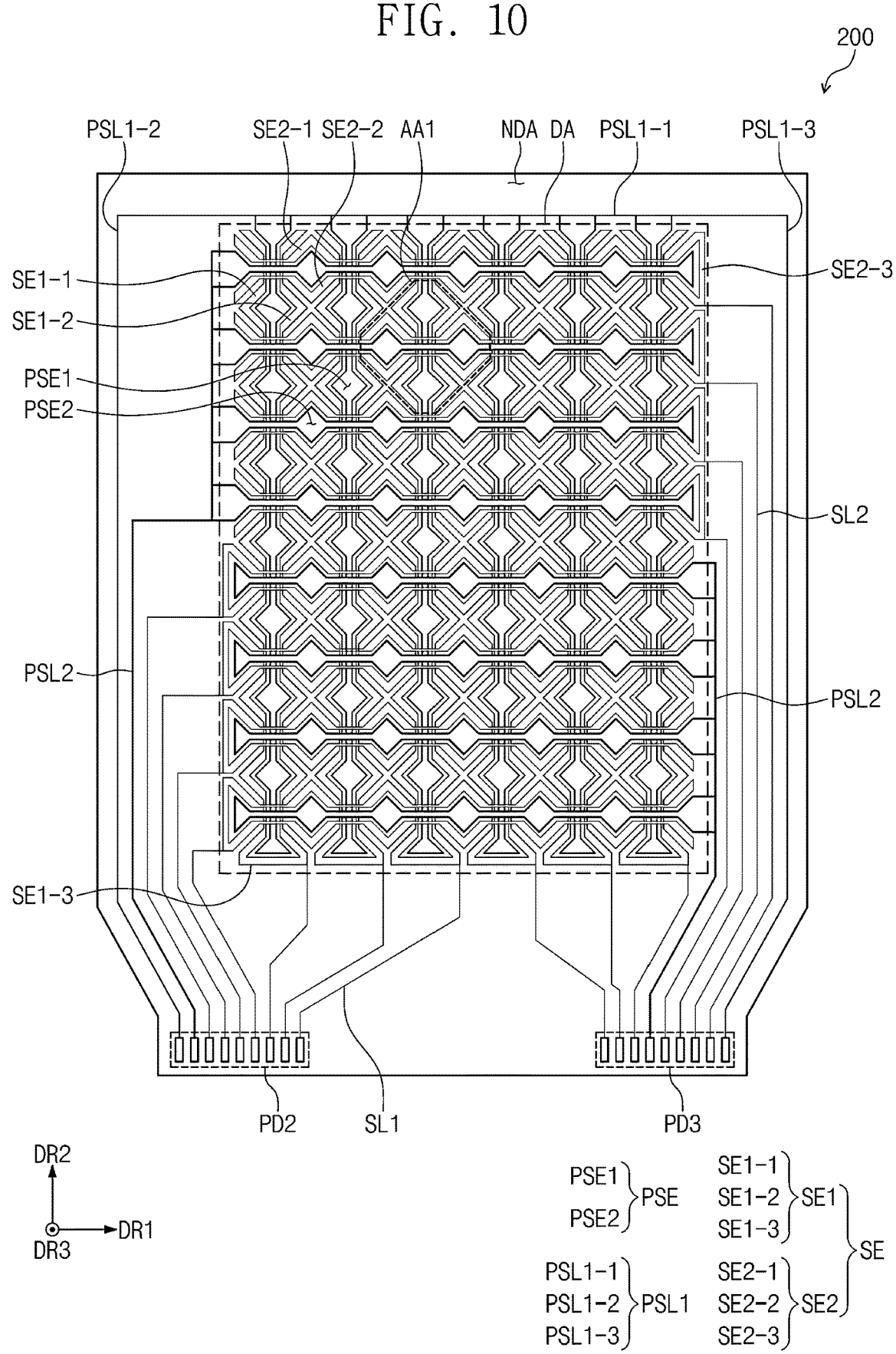
FIG. 10 is a plan view of an input sensor according to an embodiment of the inventive concept.

For example, the charge electrode PCE may be in various forms other than the type shown in FIG. 8. For example, the charge electrode PCE may have the same form as the sensing electrodes of the input sensor 200 (FIG. 10). In addition, the charge electrode PCE may have a mesh structure. The unit charge electrodes PCE-U included in the charge electrode PCE may each include a mesh-type sheet composed of a plurality of conductive lines, and the conductive lines having a mesh structure may be patterned to correspond to semiconductor patterns, conductive patterns, and signal lines included in the driving element layer 120. The conductive lines included in the charge electrode PCE may be patterned according to the arrangement cycle of each pixel PX (FIG. 5).

The display panel 100 may further include signal lines connected to the charge electrode PCE. In an embodiment, the plurality of unit charge electrodes PCE-U included in the charge electrode PCE may include two ends spaced apart along the second direction DR2, and the display panel 100 may include first voltage lines PCL1 connected to one end of the unit charge electrodes PCE-U and second voltage lines PCL2 connected to other ends of the unit charge electrodes PCE-U. The second voltage lines PCL2 may include a first portion PCL2-1 extending in the first direction DR1 and connected to ends disposed in an upper region of the charge electrode PCE, a second portion PCL2-2 bent from the first portion PCL2-1 and connected to the first voltage pad PPD1, and a third portion PCL2-3 bent from the first portion PCL2-1 and connected to the second voltage pad PPD2.

At least a portion of the charge electrode PCE may overlap the display region 100-DA. The first voltage lines PCL1 and the second voltage lines PCL2 may each be disposed in the non-display region NDA. The charge electrode PCE and each of the first and second voltage lines PCL1 and PCL2 may be disposed on the same layer or may be disposed on different layers. In an embodiment, the first voltage lines PCL1 and the second voltage lines PCL2 may each be the connection line CNE1 shown in FIG. 7A or may each be a connection line connected to the flexible circuit board FCB shown in FIG. 7B.

The display panel 100 may include first voltage pads PPD1 and second voltage pads PPD2. The first voltage pads PPD1 and the second voltage pads PPD2 may be disposed in regions spaced apart from one another in the first direction DR1. The first voltage lines PCL1 and the second voltage lines PCL2 may each be connected to at least one corresponding pad among the first voltage pads PPD1 and the second voltage pads PPD2. The first voltage pads PPD1 and the second voltage pads PPD2 may be adjacent to a lower end of the display panel 100, when viewed on a plane. When viewed on a plane, the first pads PD1 shown in FIG. 5 may be disposed between the first voltage pads PPD1 and the second voltage pads PPD2.

FIGS. 9A to 9C are plan views showing a charging section among operating sections of the charge electrode PCE of FIG. 8.

In FIGS. 9A to 9C, for convenience of description, among the three first voltage lines PCL1, the first voltage lines PCL1 on the left are defined as a (1-1)-th voltage line PCL1-1, the first voltage lines PCL1 in the middle are defined as a (1-2)-th voltage line PCL1-2, and the first voltage lines PCL1 on the right are defined as a (1-3)-th voltage line PCL1-3.

Over the charging section, the second voltage lines PCL2 may receive a driving signal or a ground voltage from at least one of the first voltage pad PPD1 or the second voltage pad PPD2. As for lines that receive the ground voltage, some of the (1-1)-th voltage line PCL1-1, the (1-2)-th voltage line PCL1-2, and the (1-3)-th voltage line PCL1-3 are selected, and some may be non-selected. The selected signal lines may receive a driving signal or a ground voltage. The charge electrode PCE connected to the selected signal lines may also receive a driving signal or a ground voltage. The non-selected signal lines may be in a floating state. Some of the second voltage lines PCL2, the charge electrodes PCE, and the first voltage lines PCL1 may be selected to form a current path in the coil (or to define the coil).

Referring to FIG. 9A, over a first section of the charging section, the driving circuit of the display module may select the first voltage pad PPD1 connected to the second voltage lines PCL2 and the first voltage pad PPD1 connected to the (1-2)-th voltage lines PCL1-2. The driving circuit of the display module applies a driving signal to the first voltage pad PPD1 connected to the second voltage lines PCL2, and applies a ground voltage to the first voltage pad PPD1 connected to the (1-2)-th voltage lines PCL1-2. In this case, the (1-1)-th voltage line PCL1-1 and the (1-3)-th voltage line PCL1-3 may be in a floating state. The second voltage lines PCL2, the unit charge electrode PCE-U disposed in the middle among the charge electrodes PCE, and the (1-2)-th voltage line PCL1-2 define a coil-type current path. The coil-type current path may generate a magnetic field.

Referring to FIG. 9B, over a second section of the charging section, the driving circuit of the display module may select the first voltage pad PPD1 connected to the (1-1)-th voltage line PCL1-1 and the second voltage pad PPD2 connected to the (1-3)-th voltage lines PCL1-3. The driving circuit of the display module applies a driving signal to the first voltage pad PPD1 connected to the (1-1)-th voltage lines PCL1-1, and applies a ground voltage to the second voltage pad PPD2 connected to the (1-3)-th voltage lines PCL1-3. The (1-1)-th voltage line PCL1-1, the unit charge electrode PCE-U disposed on the left among the charge electrodes PCE, the second voltage line PCL2, and the unit charge electrode PCE-U disposed on the right among the charge electrodes PCE, and the (1-3)-th voltage line PCL1-3 define a coil-type current path. The coil-type current path may generate a magnetic field.

Referring to FIG. 9C, over a third section of the charging section, the driving circuit of the display module may select the first voltage pad PPD1 connected to the (1-2)-th voltage line PCL1-2 and the second voltage pad PPD2 connected to the second voltage lines PCL2. The driving circuit of the display module applies a driving signal to the first voltage pad PPD1 connected to the (1-2)-th voltage lines PCL1-2, and applies a ground voltage to the second voltage pad PPD2 connected to the second voltage lines PCL2. The (1-2)-th voltage lines PCL1-2, the unit charge electrode PCE-U disposed in the middle among the charge electrodes PCE, and the second voltage line PCL2 define a coil-type current path. The coil-type current path may generate a magnetic field.

Over the charging section described in FIGS. 9A to 9C, a constant voltage may be applied to some unit charge electrodes PCE-U of the charge electrodes PCE through the first voltage line PCL1 and the second voltage line PCL2. The driving order of the charging section described in FIGS. 9A to 9C is presented as an example and the embodiment of the inventive concept is not necessarily limited thereto. The operating sequence of the first to third sections may vary. In addition, among the charge electrodes PCE, the two unit charge electrodes PCE-U that are most adjacent may define a portion of the coil-type current path.

Referring to FIG. 9B, the resonance circuit of the stylus pen STP may be charged over the second section of the charging section. The resonance circuit of the stylus pen STP disposed on the unit charge electrode PCE-U disposed in the middle receives a magnetic field formed in the current path described with reference to FIG. 9B. The resonance circuit of the stylus pen STP resonates using signals received through a change in the magnetic field in the current path described with reference to FIG. 9B. The resonance circuit of the stylus pen STP may include an inductor L and a capacitor C connected to the inductor L. An LC resonance circuit may be formed by the inductor L and the capacitor C. The capacitor C may be a variable capacitor with variable capacity.

FIG. 10 is a plan view of the input sensor 200, according to an embodiment of the inventive concept.

Referring to FIG. 10, the input sensor 200 may detect a first input through a capacitive mode and a second input through an electromagnetic induction mode. The first input may be an input from the body part of a user FG described with reference to FIG. 1A, and the second input may be an input from the stylus pen STP described with reference to FIG. 1A. For example, the first input may be an input that may change capacitance, and the second input may be an input that provides magnetic field signals.

Through time division driving, the input sensor 200 may detect the first input and the second input. The input sensor 200 may include a sensing electrode for detecting the first input and the second input. A section in which the input sensor 200 operates in a first mode to detect the first input may be defined as a first operation section, and a section in which the input sensor 200 operates in a second mode to detect the second input may be defined as a second operation section. The first mode and the second mode may be switched by the selection of a user, or any one of the first mode and the second mode may be activated or switched by activation of a specific application. While the input sensor 200 operates alternately in the first mode and the second mode, when the first input is detected, the input sensor 200 may remain in the first mode, or when the second input is detected, the input sensor 200 may remain in the second mode.

The sensing electrode of the input sensor 200 may include a first group of electrodes SE for detecting the first input and a second group of electrodes PSE for detecting the second input. As an example, six second group of first electrodes PSE1 and eight second group of second electrodes PSE2 are shown, but the input sensor 200 may include a greater number of the second group of first electrodes PSE1 and the second group of second electrodes PSE2. For example, the form of the first group of electrodes SE and the second group of electrodes PSE is not necessarily limited to the form shown in FIG. 10, and the input sensor 200 may be modified into various forms for the input sensor 200 to detect the first input and the second input.

The first group of electrodes SE may include the first group of first electrodes SE1 arranged in the first direction DR1 and extending in the second direction DR2, and the first group of second electrodes SE2 crossing the first group of first electrodes SE1. The first group of first electrodes SE1 and the first group of second electrodes SE2 may be capacitively coupled.

The driving circuit of the input sensor 200 provides a driving signal to any one of the first group of first electrodes SE1 and the first group of second electrodes SE2, and the sensing circuit of the input sensor 200 measures changes in capacitance amount of mutual capacitor formed between the first group of first electrodes SE1 and the first group of second electrodes SE2 through another electrode among the first group of first electrodes SE1 and the first group of second electrodes SE2. After performing the operation described above over the first section of the first operation section, the above-described operation may be performed in reverse over the second section of the first operation section. The first section and the second section may be repeated as a set.

The second group of electrodes PSE may include the second group of first electrodes PSE1 arranged in the first direction DR1 and extending in the second direction DR2, and the second group of second electrodes PSE2 crossing the second group of first electrodes PSE1. The magnetic field signals output from the stylus pen STP (see FIG. 1A) may be detected through the second group of first electrodes PSE1 and the second group of second electrodes PSE2. The driving circuit of the input sensor 200 provides a driving signal to at least one of the second group of first electrodes PSE1 and the second group of second electrodes PSE2, and the detection circuit of the input sensor 200 detects the electromagnetically induced current formed in the second group of first electrodes PSE1 and the second group of second electrodes PSE2.

The input sensor 200 may include a first group of first signal lines SL1 connected to one end of each of the first group of first electrodes SE1, a first group of second signal lines SL2 connected to ends of the first group of second electrodes SE2, a second group of first signal lines PSL1 connected to the second group of first electrodes PSE1, and a second group of second signal lines PSL2 connected to one end of the second group of second electrodes PSE2.

The first group of first electrodes SE1, the first group of second electrodes SE2, the second group of first electrodes PSE1, and the second group of second electrodes PSE2 may be disposed in the display region DA. The first group of first signal lines SL1, the first group of second signal lines SL2, the second group of first signal lines PSL1, and the second group of second signal lines PSL2 may be disposed in the non-display region NDA. The electrodes SE1, SE2, PSE1, and PSE2 and the signal lines SL1, SL2, PSL1, and PSL2 may be disposed on the same layer or on different layers.

The input sensor 200 may include second pads PD2 and third pads PD3. The second pads PD2 and third pads PD3 may be disposed in regions spaced apart from one another in the first direction DR1. The first group of first signal lines SL1, the first group of second signal lines SL2, the second group of first signal lines PSL1, and the second group of second signal lines PSL2 may each be connected to at least one corresponding pad among the second pads PD2 and the third pads PD3. The second pads PD2 and the third pads PD3 may be adjacent to a lower end of the input sensor 200, when viewed on a plane. When viewed on a plane, the first pads PD1 shown in FIG. 5 may be disposed between the second pads PD2 and the third pads PD3.

The input sensor 200 may be divided into a left region and a right region, with respect to the center of the first direction DR1. The second pads PD2 are disposed in the left region, and the third pads PD3 are disposed in the right region. The first group of first signal lines SL1 connected to the first electrodes SE1 disposed in the left region may be connected to the second pads PD2. The first group of first signal lines SL1 connected to the first electrodes SE1 disposed in the right region may be connected to third pads PD3.

The input sensor 200 may be divided into an upper region and a lower region with respect to the center of the second direction DR2. Some of the first group of second signal lines SL2 may be connected to left ends of the first group of second electrodes SE2 disposed in the upper region. Some of the first group of second signal lines SL2 described above may be connected to second pads PD2. Others of the first group of second signal lines SL2 may be connected to right ends of the first group of second electrodes SE2 disposed in the lower region. The others of the first group of second signal lines SL2 described above may be connected to third pads PD3.

The first group of first electrodes SE1 may each include a (1-1)-th extension portion SE1-1 and a (1-2)-th extension portion SE1-2 extending in the second direction DR2 and spaced apart from one another in the first direction DR1. The (1-1)-th extension portion SE1-1 and the (1-2)-th extension portion SE1-2 may be in the form that the two are symmetrical (e.g., horizontally symmetrical or left-right symmetrical) with respect to the second direction DR2.

The first group of first electrodes SE1 may each further include a first middle portion SE1-3. FIG. 10 shows the first middle portion SE1-3 disposed in the lower region as an example. The first middle portion SE1-3 might not be disposed in the upper region. The first middle portion SE1-3 may extend in the first direction DR1. The first middle portion SE1-3 may be disposed between the (1-1)-th extension portion SE1-1 and the (1-2)-th extension portion SE1-2. The first group of first signal lines SL1 may be connected to the first middle portion SE1-3.

The first group of second electrodes SE2 may each include a (2-1)-th extension portion SE2-1 and a (2-2)-th extension portion SE2-2 extending in the first direction DR1 and spaced apart from one another in the second direction DR2. The (2-1)-th extension portion SE2-1 and the (2-2)-th extension portion SE2-2 may be symmetrical (e.g., vertically symmetrical or top and bottom symmetrical) with respect to the first direction DR1. The second group of second electrodes PSE2 may be disposed between the (2-1)-th extension portion SE2-1 and the (2-2)-th extension portion SE2-2.

The first group of second electrodes SE2 may each further include a second middle portion SE2-3. The second middle portion SE2-3 of the first group of second electrodes SE2 disposed in the upper region may be disposed on the right side or might not be disposed on the left side. The second middle portion SE2-3 of the first group of second electrodes SE2 disposed in the lower region may be disposed on the left side.

The second middle portion SE2-3 may extend in the second direction DR2. The second middle portion SE2-3 may be disposed between one end of the (2-1)-th extension portion SE2-1 and one end of the (2-2)-th extension portion SE2-2. The first group of second signal lines SL2 may be connected to the second middle portion SE2-3.

The second group of first electrodes PSE1 may each extend in the second direction DR2 and be spaced apart from one another in the first direction DR1. The second group of first electrodes PSE1 may be disposed on the same layer as the first group of first electrodes SE1. The second group of first electrodes PSE1 may be disposed between the (1-1)-th extension portion SE1-1 and the (1-2)-th extension portion SE1-2 of the corresponding first group of first electrodes SE1.

In the upper region, ends of the second group of first electrodes PSE1 may be connected through the second group of first signal lines PSL1. One end of the second group of first signal lines PSL1 may be connected to the second pad PD2, and the other end may be connected to the third pad PD3. The second group of first signal lines PSL1 may include a first portion PSL12-1 extending in the first direction DR1 and connected to ends disposed in an upper region of the second group of first electrodes PSE1, a second portion PSL12-2 bent from the first portion PSL12-1 and connected to the second pad PD2, and a third portion PSL12-3 bent from the first portion PSL12-1 and connected to the third pad PD3.

The second group of second electrodes PSE2 may each extend in the first direction DR1 and be spaced apart from one another in the second direction DR2. The second group of second electrodes PSE2 may be disposed on the same layer as the first group of second electrodes SE2. The second group of second electrodes PSE2 may be disposed between the (2-1)-th extension portion SE2-1 and the (2-2)-th extension portion SE2-2 of the corresponding first group of second electrodes SE2.

Left ends of the second group of second electrodes PSE2 disposed in the upper region may be connected to one of the second group of second signal lines PSL2. Right ends of the second group of second electrodes PSE2 disposed in the lower region may be connected to another one of the second group of second signal lines PSL2. However, the connection relationship between the second group of second electrodes PSE2 and the second group of second signal lines PSL2 is not necessarily limited what is described above. For example, in an embodiment of the inventive concept, the left ends or the right ends of the second group of second electrodes PSE2 may all be connected to the same second group of second signal lines PSL2.

Figure 11:
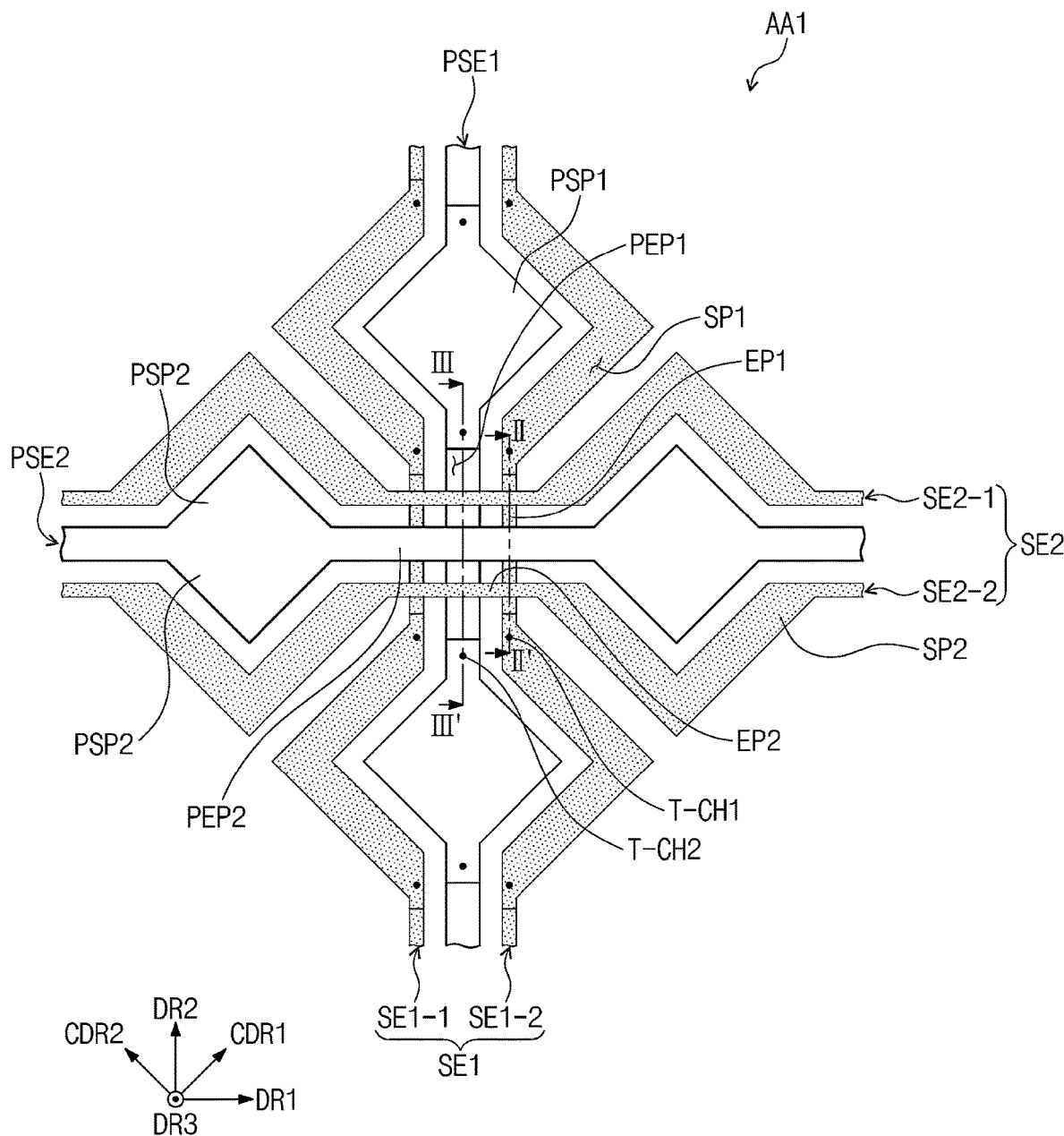
FIG. 11 is a plan view enlarging a portion of an input sensor according to an embodiment of the inventive concept.
Figure 12:
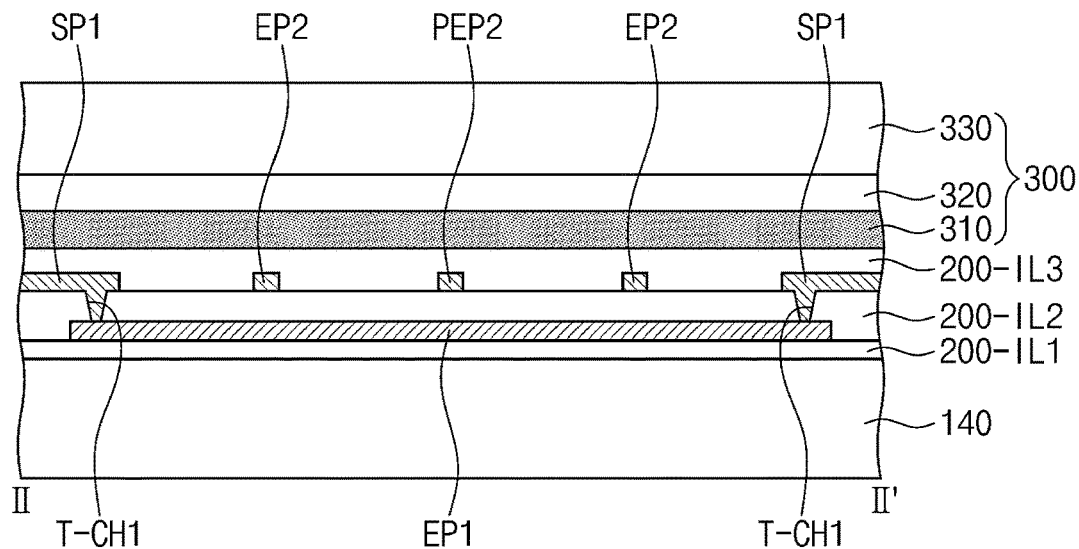
FIGS. 12 and 13 are each a cross-sectional view showing a portion of an input sensor according to an embodiment of the inventive concept.
Figure 13:
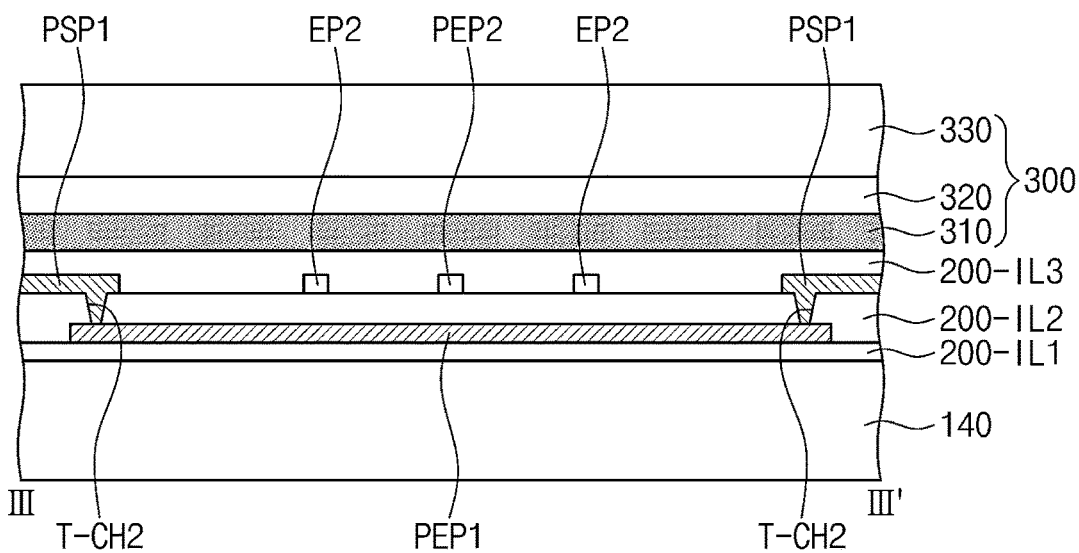
Figure 14:
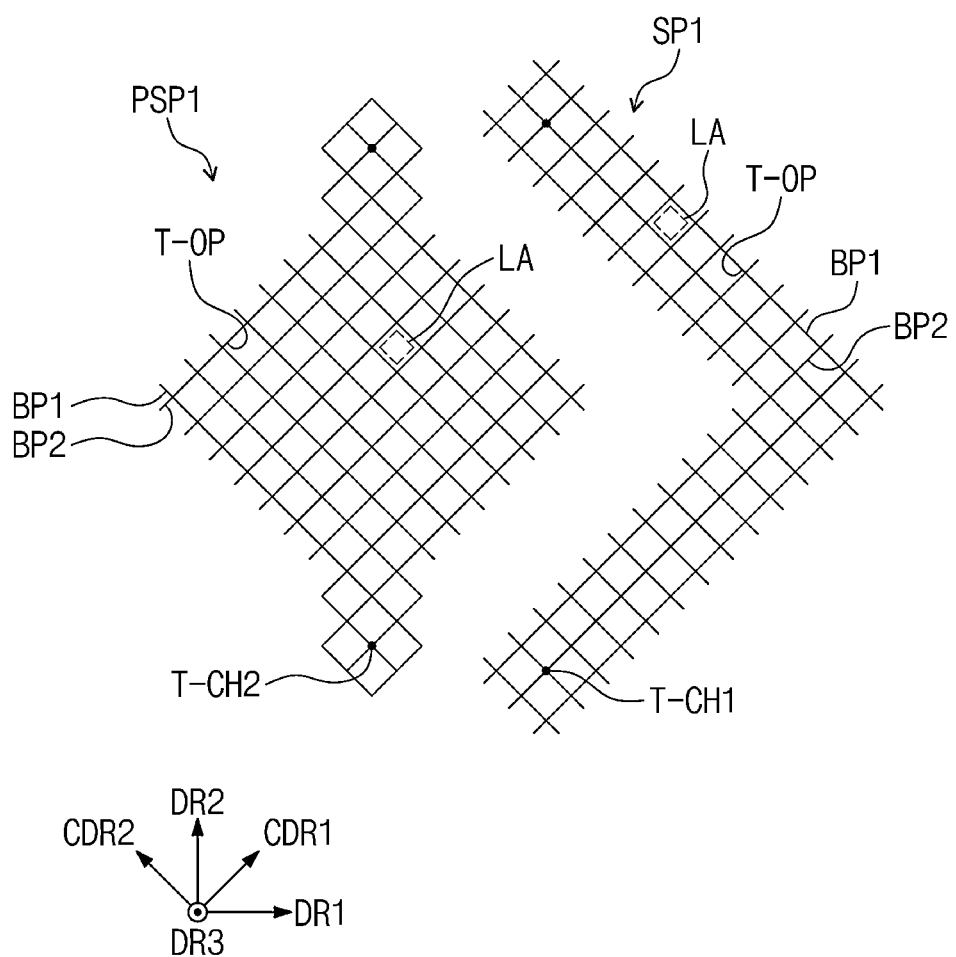
FIG. 14 is a plan view enlarging a portion of an input sensor according to an embodiment of the inventive concept.

FIG. 11 is a plan view enlarging a portion of an input sensor according to an embodiment of the inventive concept. FIG. 11 is a plan view enlarging intersection region AA1 of FIG. 10. FIGS. 12 and 13 are each a cross-sectional view showing a portion of an input sensor according to an embodiment of the inventive concept. FIG. 12 is a cross-sectional view of an input sensor corresponding to II-II' of FIG. 11. FIG. 13 is a cross-sectional view of an input sensor corresponding to III-III' of FIG. 11. FIG. 14 is a plan view enlarging a portion of an input sensor according to an embodiment of the inventive concept. FIG. 14 is a plan view enlarging some of the electrodes shown in FIG. 11.

Referring to FIGS. 11 and 12, the (1-1)-th extension portion SE1-1 and the (1-2)-th extension portion SE1-2 of the first group of first electrode SE1 may each include first sensing portions SP1 arranged in the second direction DR2, and first middle portions EP1 (or intersection portions) connecting two adjacent sensing portions among the first sensing portions SP1. The first sensing portions SP1 may be bent. For example, the first sensing portions SP1 may be bent toward the left or right in the first direction DR1 to keep a constant distance from the second group of first electrodes PSE1. The first sensing portions SP1 may have a greater width than first middle portions EP1.

The first middle portion EP1 is disposed on a different layer from the first sensing portions SP1. The first middle portion EP1 disposed below the second insulating layer 200-IL2 may correspond to a bridge. A bridge such as the first middle portion EP1 may be disposed in a region where conductive patterns intersect. The bridge may form a portion of the first conductive pattern among the first and second conductive patterns. The other portion of the first conductive pattern and the second conductive pattern may be disposed on a different layer from the bridge.

The first middle portion EP1, which is a bridge, may prevent a short circuit between the (1-1)-th extension portion SE1-1 and the (1-2)-th extension portion SE1-2 and the first group of second electrodes SE2 and the second group of second electrodes PSE2. The first middle portion EP1 may connect the two adjacent first sensing portions SP1 to one another through the first contact holes T-CH1 passing through the second insulating layer 200-IL2.

The (2-1)-th extension portion SE2-1 and the (2-2)-th extension portion SE2-2 of the first group of first electrodes SE2 may each include second sensing portions SP2 arranged in the first direction DR1, and second middle portions EP2 disposed between two adjacent sensing portions among the second sensing portions SP2. The second sensing portions SP2 may be bent. For example, the second sensing portions SP2 may be bent upward or downward in the second direction DR2 to keep a constant distance from the second group of second electrodes PSE2.

The second middle portion EP2 is disposed on the same layer (e.g., the second insulating layer 200-IL2) as the second sensing portions SP2. The second middle portion EP2 may have a single-body shape along with the second sensing portions SP2.

The first sensing portions SP1 and the second sensing portions SP2 might not overlap one another and may be spaced apart from one another. The first sensing portions SP1 and the second sensing portions SP2 may be alternately disposed in a first crossing direction CDR1 and a second crossing direction CDR2. A mutual capacitor may be formed between the first sensing portions SP1 and the second sensing portions SP2.

Referring to FIGS. 11 and 13, the second group of first electrodes PSE1 may include third sensing portions PSP1 arranged in the second direction DR2, and third middle portions PEP1 connecting two adjacent sensing portions among the third sensing portions PSP1. The third sensing portions PSP1 may protrude toward the left and right in the first direction DR1. The third sensing portions PSP1 may have a rhombus-like shape.

The third middle portion PEP1 is disposed on a different layer from the third sensing portions PSP1. The third middle portion PEP1 disposed below the second insulating layer 200-IL2 corresponds to a bridge. The third middle portion PEP1, which is a bridge, may prevent a short circuit between the (1-1)-th extension portion SE1-1 and the (1-2)-th extension portion SE1-2 and the first group of second electrodes SE2 and the second group of second electrodes PSE2. The third middle portion PEP1 connects the two adjacent third sensing portions PSP1 through the second contact holes T-CH2 passing through the second insulating layer 200-IL2.

The second group of second electrodes PSE2 may include fourth sensing portions PSP2 arranged in the first direction DR1, and fourth middle portions PEP2 connecting two adjacent sensing portions among the fourth sensing portions PSP2. The fourth sensing portions PSP2 may protrude upward and downward in the second direction DR2. The fourth middle portion PEP2 is disposed on the same layer (e.g., the second insulating layer 200-IL2) as the fourth sensing portions PSP2. The fourth middle portion PEP2 may have a single-body shape along with the fourth sensing portions PSP2.

The position of the bridge may be changed, and the portion including the bridge may be changed. According to an embodiment of the inventive concept, unlike the embodiment described with reference to FIGS. 10 to 13, bridges may be provided on each of the first group of second electrodes SE2 and the second group of second electrodes PSE2.

Some of the first group of first signal lines SL1, the first group of second signal lines SL2, the second group of (1-1)-th signal lines PSL11, the second group of (1-2)-th signal lines PSL12, and the second group of second signal lines PSL2 shown in FIG. 10 may be disposed on the same layer as the third middle portion PEP1, and other portions thereof may be disposed on the same layer as the third sensing portions PSP1. This arrangement is designed to prevent short circuits in the signal lines described above. In an embodiment of the inventive concept, most of the signal lines described above may be disposed on the same layer. However, a bridge may be disposed in a region where signal lines intersect.

For example, the first group of electrodes SE and the second group of electrodes PSE described with reference to FIGS. 10 to 13 may each have a thickness of about 0.1 μm to about 1 μm. When the thickness of each of the first group of electrodes SE and the second group of electrodes PSE is less than 0.1 μm, line resistance may increase and the input sensor 200 may have reduced input detection performance. When the thickness of each of the first group of electrodes SE and the second group of electrodes PSE is greater than 1 μm, the input sensor 200 may have excessively increased thickness to increase a total thickness of the electronic device ED (see FIG. 1A), and deteriorate folding characteristics.

The line resistance of each of the first group of electrodes SE and the second group of electrodes PSE may be 100Ω or less. The first group of electrodes SE and the second group of electrodes PSE may each have a low resistance of 100Ω or less. In the display module of an embodiment, as described above in FIGS. 6 to 8, the charge electrode PCE for charging the stylus pen STP (see FIG. 1A) is separately provided between a plurality of resin layers included in the base layer 110 of the display panel 100, and accordingly, in the input sensor 200, space for disposing electrodes and lines for charging the stylus pen STP (see FIG. 1A) is not required, resulting in a greater number of channels of the first group of electrodes SE and the second group of electrodes PSE. Accordingly, the sensing electrodes such as the first group of electrodes SE and the second group of electrodes PSE may have a low resistance value of 100Ω or less, and the driving voltage for driving the sensing electrodes may be lowered to about 3.3 V or less.

FIG. 14 shows a view enlarging the first sensing portion SP1 and the third sensing portion PSP1 shown in FIG. 10. The first sensing portion SP1 is shown to represent the first group of electrodes SE, and the third sensing portion PSP1 is shown to represent the second group of electrodes PSE.

Referring to FIG. 14, the first sensing portion SP1 and the third sensing portion PSP1 may be in the shape of a mesh. For example, the first sensing portion SP1 and the third sensing portion PSP1 may each include first conductive lines BP1 extending in the first crossing direction CDR1 and second conductive lines BP2 extending in the second crossing direction CDR2. The first conductive lines BP1 and the second conductive lines BP2 are formed through the same process and may have a sing-body shape. A mesh-type sheet formed of the first conductive lines BP1 and the second conductive lines BP2 may be patterned to form the first group of first electrodes SE1, the first group of second electrodes SE2, the second group of first electrodes PSE1, and the second group of second electrodes PSE2.

Openings T-OP having the shape of a rhombus may be defined by the first conductive lines BP1 and the second conductive lines BP2. The openings T-OP may correspond to the light emitting region LA shown in FIG. 6. For example, the first conductive lines BP1 and the second conductive lines BP2 overlap the non-light emitting region NLA shown in FIG. 6.

Figure 15:
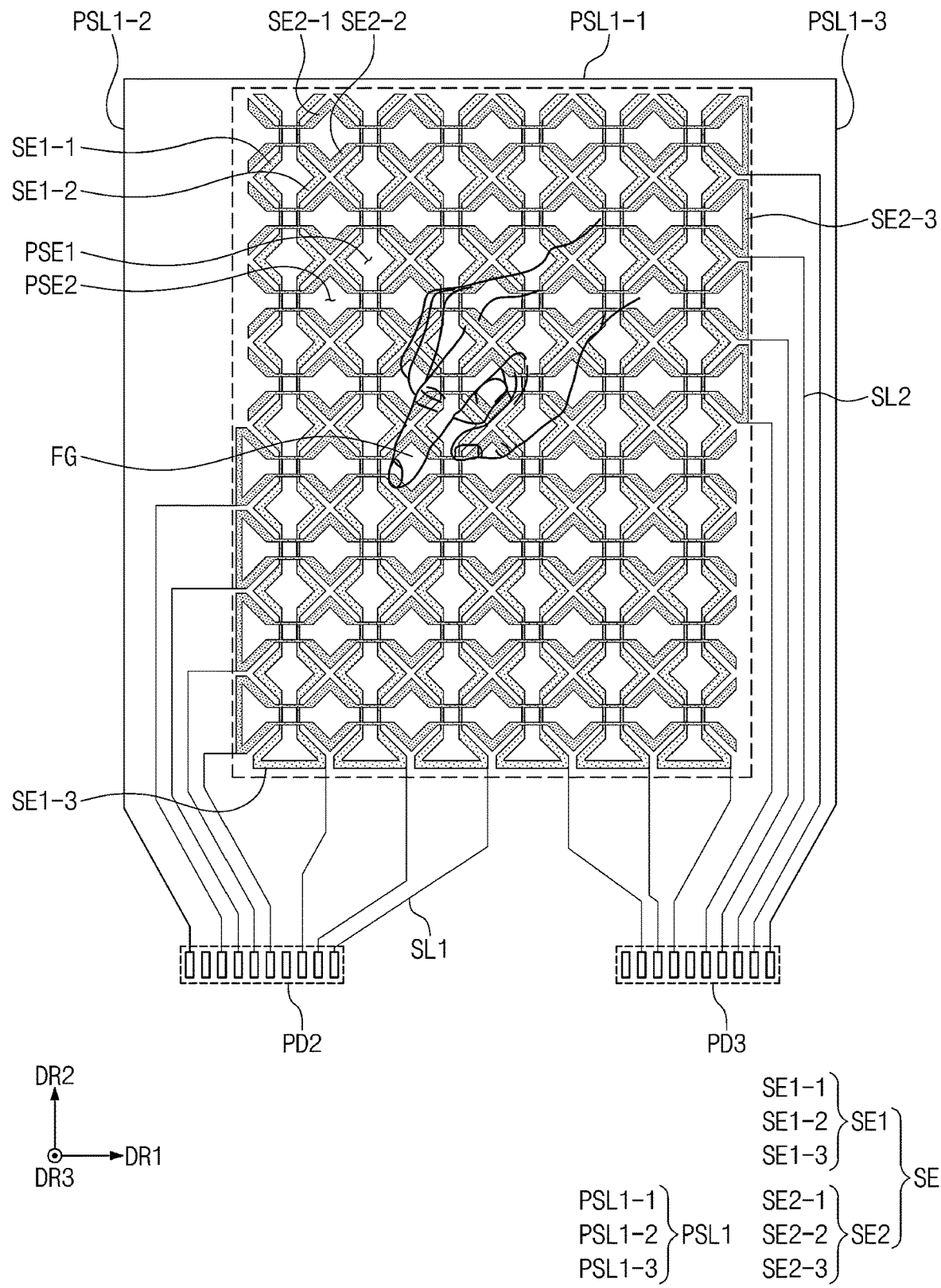
FIG. 15 is a plan view showing a first sensing section of electrodes included in an input sensor of an embodiment of the inventive concept.

FIG. 15 is a plan view showing a first sensing section of electrodes included in an input sensor of an embodiment of the inventive concept. FIG. 15 is a plan view showing an operation section of the first group of electrodes SE in FIG. 10.

Over the first sensing section, the second group of electrodes PSE in FIG. 7 are not involved in the operation of the input sensor 200. For example, a driving signal is not provided to the second group of electrodes PSE, and no signal is detected from the second group of electrodes PSE. The second group of electrodes PSE of FIG. 10 may also be present within the arrangement depicted within FIG. 15.

Over the first operation section, the driving circuit of the input sensor provides driving signals to the first group of first electrodes SE1 or the first group of second electrodes SE2. For example, the driving circuit of the input sensor scans the first group of first electrodes SE1 or the first group of second electrodes SE2. For example, a driving signal is sequentially provided to the first group of first electrodes SE1 through the first group of first signal lines SL1. Activation sections of the driving signal applied to the first group of first electrodes SE1 may be different. The driving signal may include a plurality of pulse waves or a plurality of sine waves in the activation section. The driving circuit of the input sensor may be embedded in a separately provided driving chip of an input sensor, or may be embedded in the driving chip DIC (see FIG. 2) mounted on the display panel 100.

Current paths are formed that progress from an electrode that receives the driving signal among the first group of first electrodes SE1 to the first group of second electrodes SE2. The current paths pass through a mutual capacitor formed between the first group of first electrodes SE1 and the first group of second electrodes SE2. Changes in capacitance of the mutual capacitor are detected through the first group of second electrodes SE2. The detection circuit of the input sensor measures the current through the first group of second electrodes SE2 and calculates changes in amount of the capacitance therefrom. For example, among the first group of second electrodes SE2, the electrode where inputs are delivered from the body part of a user FG has a different current from the other electrodes. The detection circuit of the input sensor may be embedded in a separately provided driving chip of an input sensor, or may be embedded in the driving chip DIC (see FIG. 2) mounted on the display panel 100.

Figure 16:
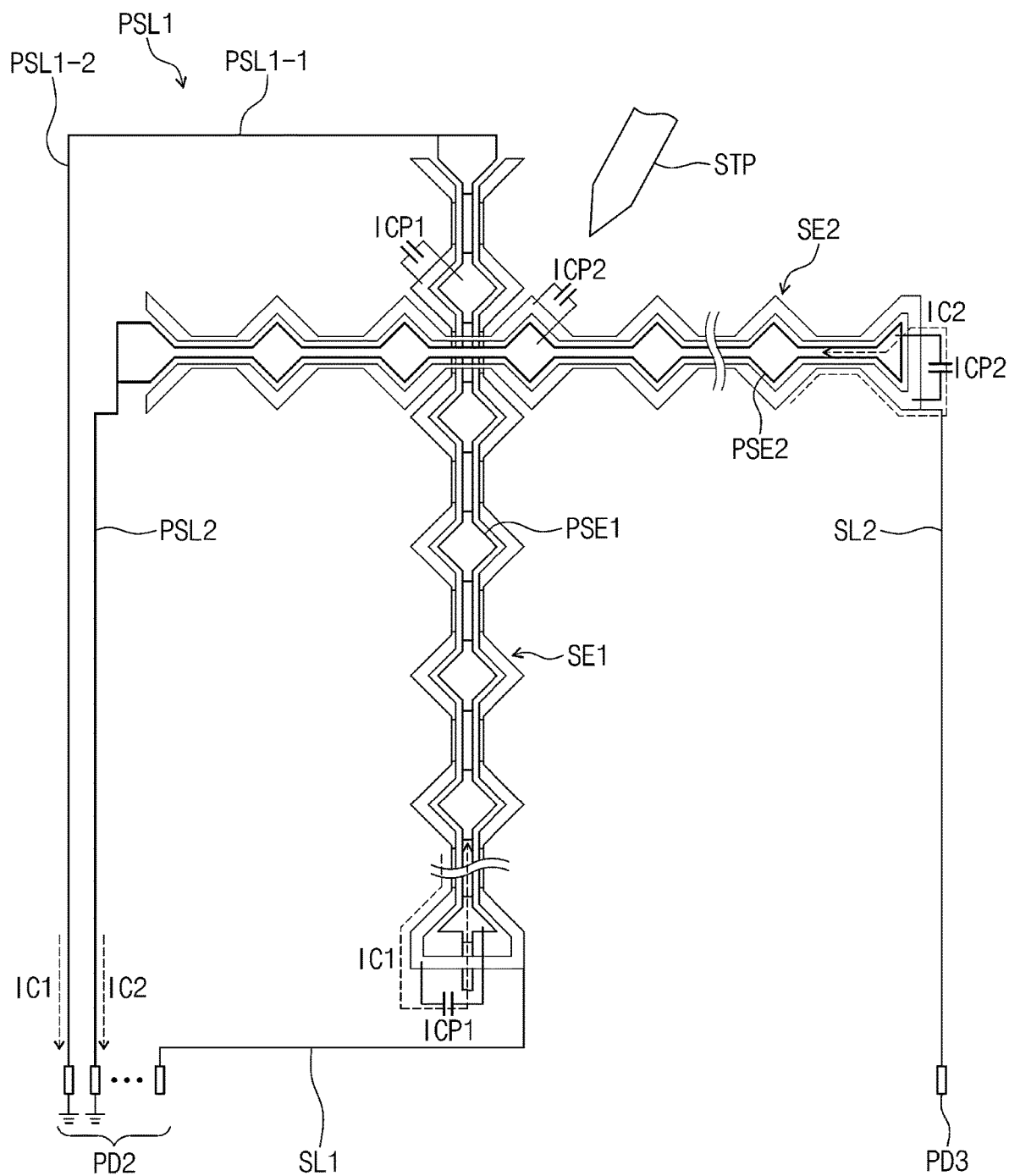
FIG. 16 is a plan view showing a second sensing section of electrodes included in an input sensor of an embodiment of the inventive concept.

FIG. 16 is a plan view showing a second sensing section of electrodes included in an input sensor of an embodiment of the inventive concept. FIG. 16 shows one first group of first electrodes SE1 and one second group of first electrodes PSE1 in which an induced current is generated by a magnetic field signal output from the stylus pen STP. An induced current is also generated in one first group of second electrodes SE2 and one second group of second electrodes PSE2 shown in FIG. 16 by the magnetic field signal output from the stylus pen STP.

Referring to FIGS. 10 and 16, over the second detection section, the detection circuit of the input sensor may ground the second group of first signal lines PSL1 and ground the second group of second signal lines PSL2. Referring to FIG. 16, the second pad PD2 connected to the second group of first signal lines PSL1 may be grounded, and the second pad connected to the second group of second signal lines PSL2 disposed in the left region may be grounded. The resonance circuit of the stylus pen STP discharges, and accordingly, a magnetic field is generated. An induced current may be generated in the input sensor 200, which is inductively coupled to the resonance circuit of the stylus pen STP, by a magnetic field emitted from the stylus pen STP.

A first capacitor ICP1 may be defined between the first group of first electrodes SE1 and the second group of first electrodes PSE1, and a second capacitor ICP2 may be defined between the first group of second electrodes SE2 and the second group of second electrodes PSE2. As the second group of first signal lines PSL1 are grounded, a first induced current IC1 may flow from the first group of first electrodes SE1 to the second group of first electrodes PSE1 through the first capacitor ICP1. In addition, as the second group of second signal lines PSL2 are grounded, a second induced current IC2 may flow from the first group of second electrodes SE2 to the second group of second electrodes PSE2 through the second capacitor ICP2. The detection circuit of the input sensor may detect the first induced current IC1 through the first group of first signal lines SL1 and the second pad PD2 connected thereto, and detect the second induced current IC2 through the first group of second signal lines SL2 and the third pad PD3 connected thereto, and may thus identify inputs from the stylus pen STP.

In a display device including a display panel and an input sensor, according to an embodiment of the inventive concept, a sensing electrode for detecting electromagnetically induced current by a stylus pen is included in the input sensor, and a charge electrode for charging the stylus pen is disposed below at least one of the resin layers included in a base layer of the display panel. For example, in the display device according to an embodiment, the sensing electrode for detecting inputs of the stylus pen and the charge electrode for charging the stylus pen may be spaced apart with a driving element layer and a light emitting element layer in which pixels are disposed therebetween. Accordingly, a structure for detecting and charging the stylus pen may be internalized in the display device, and the input sensor may include a structure dedicated to detecting the stylus pen as well. Accordingly, in the display device of an embodiment, the number of channels of the sensing electrode included in the input sensor may be greater, and the sensing electrode may thus have increased sensing performance. In addition, in an electronic device of an embodiment, the structure for sensing and charging the stylus pen is internalized in the display device, and accordingly, the electronic device of an embodiment may have a smaller thickness than an electronic device including separate pen sensing and charging devices, for example, digitizers, and may thus have increased folding characteristics.

FIGS. 17A to 17D are cross-sectional views showing a step in a method for manufacturing a display device according to an embodiment of the inventive concept. FIGS. 18A to 18D are cross-sectional views showing a step in a method for manufacturing a display device according to an embodiment of the inventive concept. In describing FIGS. 17A to 18D, the same/similar components are described using the same/similar reference numerals with reference to FIGS. 1A to 16, and to the extent that an element is not described in detail with respect to this figure, it may be understood that the element is at least similar to a corresponding element that has been described elsewhere within the present disclosure. For example, FIGS. 17A to 17D show a step in a method for manufacturing a display device in a cross-section corresponding to FIG. 7A, and FIGS. 18A to 18D show a step in a method for manufacturing a display device in a cross-section corresponding to FIG. 7B.

The method includes providing a display panel, according to an embodiment of the inventive concept, and forming an input sensor including a sensing electrode on the display panel. The providing of a display panel includes providing a base, and forming a plurality of pixels on the base. The providing of the base includes providing a lower resin layer, patterning a metal material on the lower resin layer to form a charge electrode, and forming an upper resin layer covering the charge electrode.

FIGS. 17A to 17C sequentially show the step of providing a base in the method for manufacturing a display panel according to an embodiment of the inventive concept. Referring to FIG. 17A, a charge electrode PCE may be formed on a first resin layer 110-1. The first resin layer 110-1, which provides a base surface on which the charge electrode PCE is formed, may be described as a "lower resin layer." The first resin layer 110-1 may be formed using a polymer resin. The first resin layer 110-1 may be formed of, for example, polyimide.

The charge electrode PCE may be formed by depositing a metal material through a deposition process to form a metal film and then patterning the metal film. The charge electrode PCE may be formed, for example, from molybdenum, silver, titanium, copper, aluminum, and an alloy thereof.

Referring to FIGS. 17A and 17B, a second resin layer 110-2 may be formed on the first resin layer 110-1. The second resin layer 110-2 formed on the charge electrode PCE and covering the charge electrode PCE may be described as an "upper resin layer." The second resin layer 110-2 may cover at least a portion of the charge electrode PCE. The second resin layer 110-2 may be formed using a polymer resin. The second resin layer 110-2 may be formed of, for example, polyimide.

A contact hole CNH1 may be formed in the second resin layer 110-2. A portion of an upper surface of the charge electrode PCE may be exposed through the contact hole CNH1. The second resin layer 110-2 may completely cover the upper surface of the charge electrode PCE, except for the portion where the contact hole CNH1 is formed.

Referring to FIGS. 17B and 17C, a shielding pattern BMLa and a connection line CNE1 may be formed on the second resin layer 110-2. The connection line CNE1 and the shielding pattern BMLa may be formed through the same process. For example, a conductive layer formed on the second resin layer 110-2 may be patterned to form the connection line CNE1 and the shielding pattern BMLa.

The shielding pattern BMLa may overlap the charge electrode PCE, when viewed on a plane. The shielding pattern BMLa may cover the upper portion of the charge electrode PCE. The connection line CNE1 may be connected to the charge electrode PCE through the contact hole CNH1 passing through the second resin layer 110-2. The connection line CNE1 may apply a ground voltage to the charge electrode PCE.

Figure 17D:
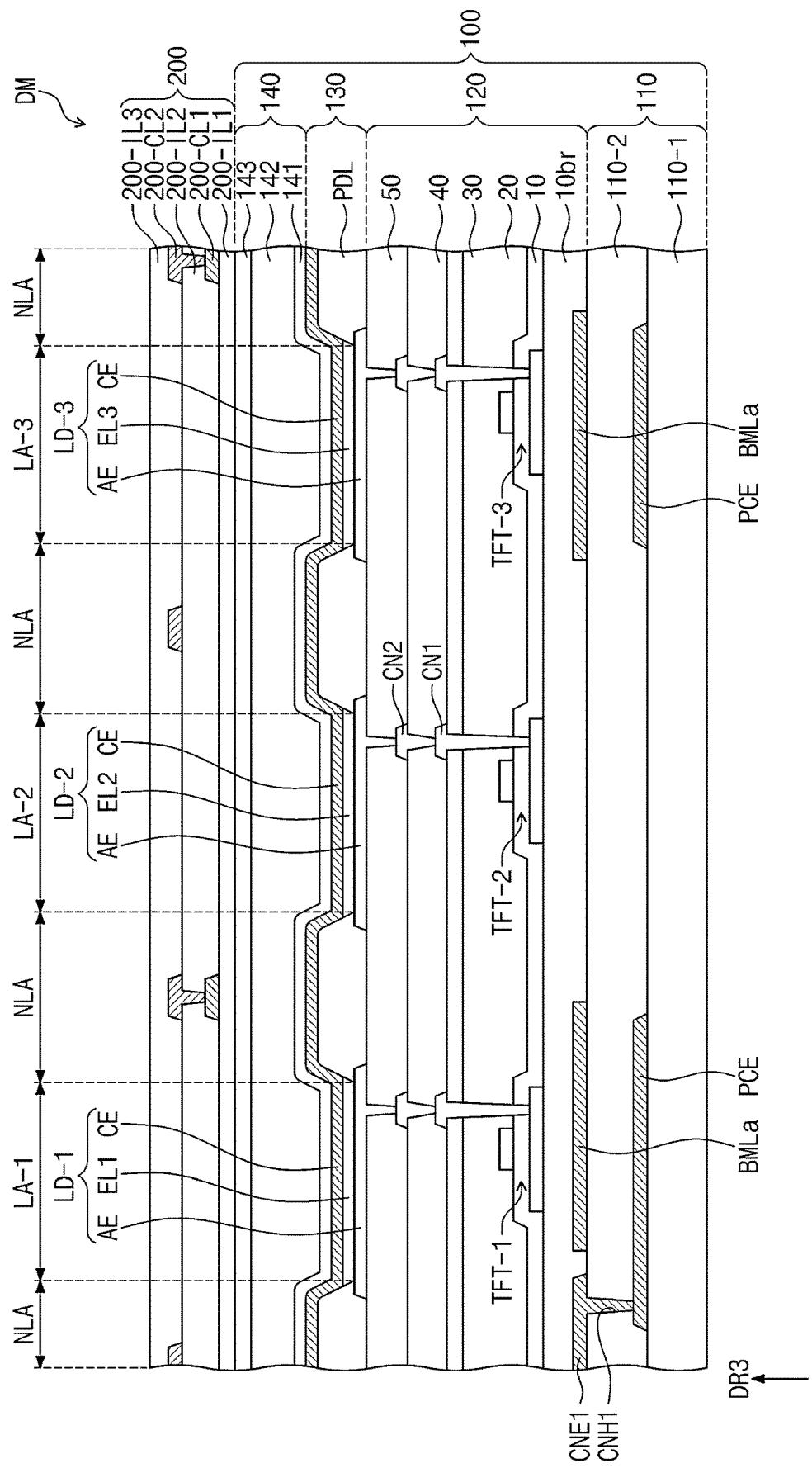

Referring to FIGS. 17C and 17D, after the forming of a base, a driving element layer 120, a light emitting element layer 130, and an encapsulation layer 140 may sequentially be formed on the base layer 110 to form a display panel 100. Thereafter, the input sensor 200 may be formed on the display panel 100. The input sensor 200 may be formed on the encapsulation layer 140. In the method for manufacturing a display device of an embodiment, the input sensor 200 including a sensing electrode for detecting electromagnetically induced current by a stylus pen is formed on the encapsulation layer 140, and the charge electrode PCE for charging the stylus pen is formed below the second resin layer 110-2 included in the base layer 110, and accordingly, a structure for detecting and charging the stylus pen may be internalized in the display device and the input sensor may have a structure dedicated to detecting the stylus pen. Accordingly, the sensing electrode may have increased sensing performance, and an electronic device including the display device formed by the method for manufacturing a display device according to an embodiment may have increased folding characteristics.

Figure 18A:
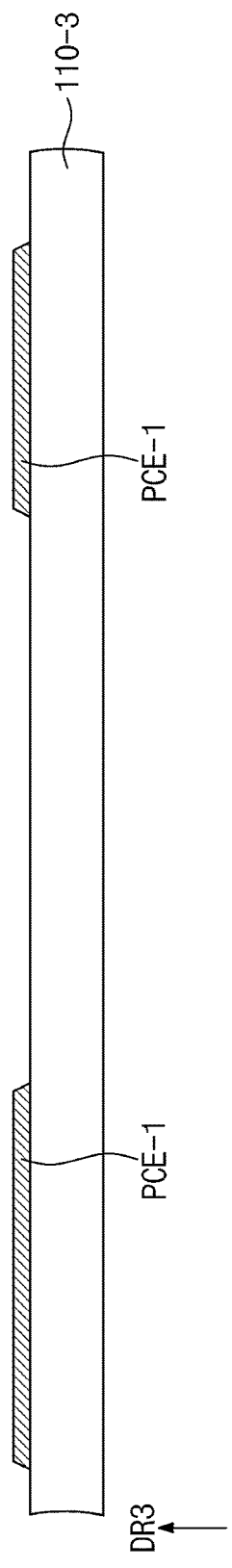
FIGS. 18A to 18D are cross-sectional views showing a step in a method for manufacturing a display device according to an embodiment of the inventive concept.
Figure 18B:
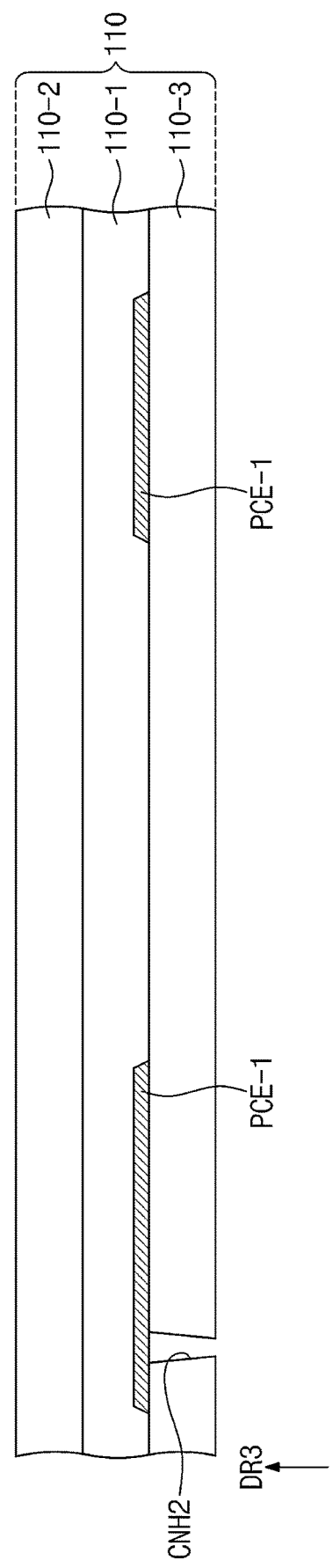
Figure 18C:
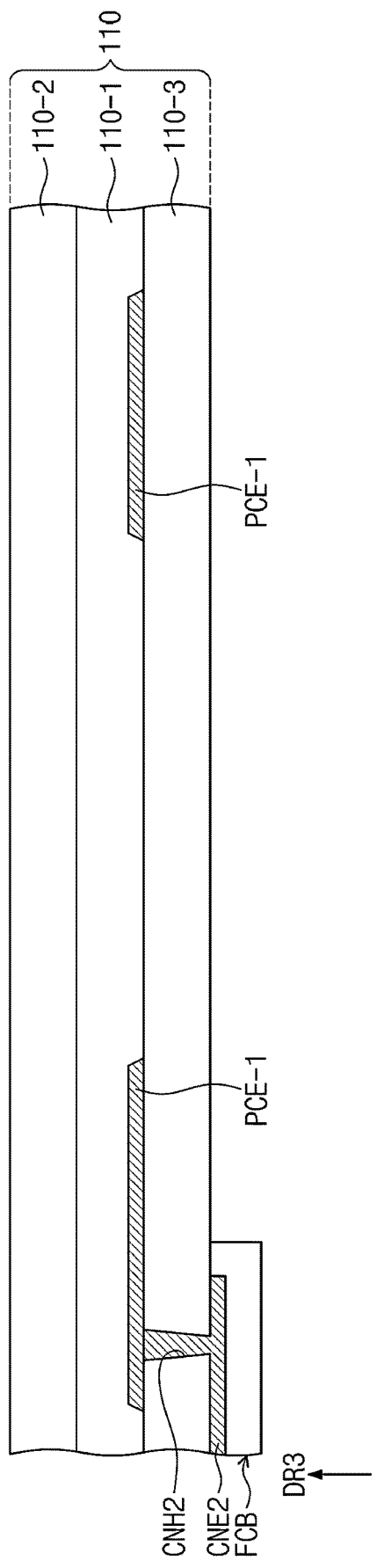

FIGS. 18A to 18C sequentially show the step of providing a base in the method for manufacturing a display panel according to an embodiment of the inventive concept. Referring to FIG. 18A, a charge electrode PCE-1 may be formed on a third resin layer 110-3. The third resin layer 110-3, which provides a base surface on which the charge electrode PCE-1 is formed, may be described as a "lower resin layer." The third resin layer 110-3 may be formed using a polymer resin. The third resin layer 110-3 may be formed of, for example, polyimide.

The charge electrode PCE-1 may be formed by depositing a metal material through a deposition process to form a metal film and then patterning the metal film. The charge electrode PCE-1 may be formed of, for example, molybdenum, silver, titanium, copper, aluminum, and an alloy thereof.

Referring to FIGS. 18A and 18B, the first resin layer 110-1 and the second resin layer 110-2 may sequentially be formed on the third resin layer 110-3. The first resin layer 110-1 formed on the charge electrode PCE-1 and covering the charge electrode PCE-1 may be described as an "upper resin layer." The first resin layer 110-1 may entirely cover the charge electrode PCE-1. The first resin layer 110-1 and the second resin layer 110-2 may be formed using a polymer resin. The first resin layer 110-1 and the second resin layer 110-2 may be formed of, for example, polyimide.

After the forming of the first resin layer 110-1 and the second resin layer 110-2 on the third resin layer 110-3, a contact hole CNH2 may be formed in the third resin layer 110-3. A portion of a lower surface of the charge electrode PCE-1 may be exposed through the contact hole CNH2. The process of forming the contact hole CNH2 may be performed, for example, through a laser drilling process.

Referring to FIGS. 18B and 18C, a portion of the flexible printed circuit board FCB may be provided below the third resin layer 110-3, and accordingly, the charge electrode PCE-1 may be electrically connected to the flexible printed circuit board FCB. The flexible circuit board FCB may be disposed below at least a portion of the third resin layer 110-3 and connected to the charge electrode PCE-1 to apply a ground voltage to the charge electrode PCE-1. In an embodiment, the charge electrode PCE-1 and the flexible printed circuit board FCB may be electrically connected through the third resin layer 110-3 disposed below the charge electrode PCE-1. In an embodiment, the charge electrode PCE may be connected to the flexible printed circuit board FCB through a contact hole CNH2 passing through the third resin layer 110-3. The charge electrode PCE-1 may be electrically connected to the connection line CNE2 included in the flexible printed circuit board FCB. For example, unlike what is shown in FIG. 18C, the charge electrode PCE-1 may be electrically connected to the flexible circuit board FCB through a separate additional connection line.

Figure 18D:
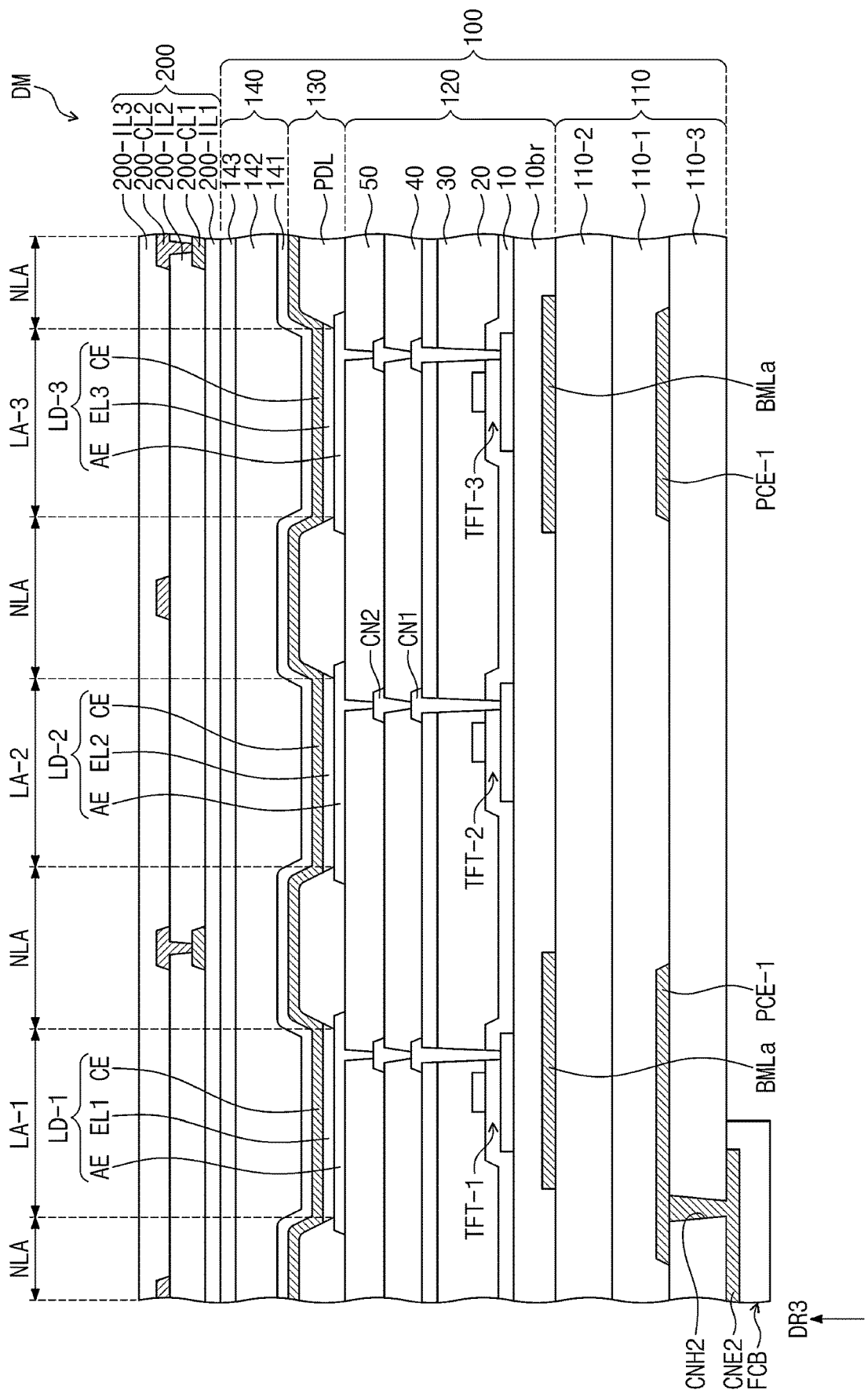

Referring to FIGS. 18C and 18D, after the forming of a base, a driving element layer 120, a light emitting element layer 130, and an encapsulation layer 140 may sequentially be formed on the base layer 110 to form a display panel 100. Thereafter, the input sensor 200 may be formed on the display panel 100. The input sensor 200 may be formed on the encapsulation layer 140.

According to an embodiment of the inventive concept, a sensing electrode detecting inputs from a stylus pen, and a charge electrode charging the stylus pen are spaced apart with pixels disposed therebetween, thereby increasing the number of channels of the sensing electrode included in the input sensor, and accordingly, the sensing electrode may have increased sensing performance.

In an electronic device of an embodiment, structures for sensing and charging a stylus pen are internalized in a display device, and accordingly, the electronic device may have a reduced thickness and increased folding characteristics.

Although the inventive concept has been described with reference to various embodiments of the inventive concept, it will be understood that the inventive concept should not necessarily be limited to these embodiments but various changes and modifications may be made by those skilled in the art without departing from the spirit and scope of the inventive concept.

What is claimed is:

1. A display device, comprising:
a display panel including a display region and a non-display region at least partially surrounding the display region; and
an input sensor disposed on the display panel and including a sensing electrode configured to detect an electromagnetically induced current,
wherein the display panel includes:
a base layer including a plurality of resin layers;
a plurality of pixels disposed on the base layer and overlapping the display region; and
a charge electrode overlapping the display region,
wherein the plurality of resin layers include:
a first resin layer; and
a second resin layer disposed on the first resin layer, and
wherein the charge electrode is disposed below the second resin layer.

2. The display device of claim 1, wherein the charge electrode is disposed on the first resin layer and is covered by the second resin layer.

3. The display device of claim 2, wherein the display panel further comprises a shielding pattern disposed on the second resin layer and overlapping the charge electrode.

4. The display device of claim 3, wherein the display panel further comprises a connection line connected to the charge electrode through a contact hole passing through the second resin layer, and including a same material as is included in the shielding pattern.

5. The display device of claim 1, wherein the base layer further comprises a third resin layer disposed below the first resin layer, and
wherein the charge electrode is disposed on the third resin layer and is covered by the first resin layer.

6. The display device of claim 5, further comprising a flexible circuit board, at least a portion of which is disposed below the display panel,
wherein the charge electrode is electrically connected to the flexible circuit board through a contact hole defined in the third resin layer.

7. The display device of claim 1, wherein the display panel further comprises an encapsulation layer disposed on the base layer and covering the plurality of pixels,
wherein the input sensor is disposed directly on the encapsulation layer.

8. The display device of claim 1, wherein the plurality of pixels each comprise a light emitting element and at least one transistor connected to the light emitting element, and
wherein the charge electrode overlaps at least a portion of the light emitting element.

9. The display device of claim 1, wherein the charge electrode defines a current path that receives a constant voltage and generates a magnetic field therefrom.

10. The display device of claim 1, wherein the charge electrode comprises a plurality of unit charge electrodes extending in a first direction and spaced apart from one another in a second direction crossing the first direction.

11. The display device of claim 1, wherein the charge electrode comprises molybdenum, silver, titanium, copper, and/or aluminum.

12. The display device of claim 1, wherein the charge electrode has a thickness of about 0.1 μm to about 1 μm.

13. The display device of claim 1, wherein at least a portion of the charge electrode comprises conductive lines having a mesh shape, and wherein the conductive lines are patterned to correspond to at least some of the plurality of pixels.

14. The display device of claim 1, wherein the sensing electrode has a thickness of about 0.1 µm to about 1 µm.

15. The display device of claim 1, wherein the sensing electrode has a line resistance of about 100 Ω or less.

16. The display device of claim 1, wherein at least a portion of the sensing electrode has a mesh shape.

17. The display device of claim 1, wherein the sensing electrode comprises:
   a first group of first electrodes extending in a first direction;
   a first group of second electrodes extending in a second direction crossing the first direction and capacitively coupled to the first group of first electrodes;
   a second group of first electrodes extending in the first direction and configured to detect the electromagnetically induced current; and
   a second group of second electrodes extending in the second direction and configured to detect the electromagnetically induced current, and
   wherein the input sensor further comprises:
      a first group of first signal lines connected to one end of the first group of first electrodes;
      a first group of second signal lines connected to one end of the first group of second electrodes;
      a second group of first signal lines connected to one end of the second group of first electrodes; and
      a second group of second signal lines connected to one end of the second group of second electrodes.

18. The display device of claim 17, wherein the first group of the first electrodes comprises:
   a (1-1)-th extension portion extending in the first direction;
   a (1-2)-th extension portion extending in the first direction and spaced apart from the (1-1)-th extension portion in the second direction; and
   a first middle portion disposed between one end of the (1-1)-th extension portion and one end of the (1-2)-th extension portion, and
   wherein the first electrode of the second group is disposed between the (1-1)-th extension portion and the (1-2) extension portion.

19. The display device of claim 17, wherein the first group of the second electrodes comprises:
   a (2-1)-th extension portion extending in the second direction;
   a (2-2)-th extension portion extending in the second direction and spaced apart from the (2-1)-th extension portion in the first direction; and
   a second middle portion disposed between one end of the (2-1)-th extension portion and one end of the (2-2)-th extension portion, and wherein the second electrode of the second group is disposed between the (2-1)-th extension portion and the (2-2) extension portion.

20. An electronic device, comprising:
   a housing;
   an electronic module disposed inside the housing;
   a display device overlapping the electronic module; and
   a stylus pen including a resonance circuit,
   wherein the display device includes:
      a display panel including a display region and a non-display region at least partially surrounding the display region; and
      an input sensor disposed on the display panel and configured to detect a resonance signal transmitted from the stylus pen,
   wherein the display panel includes:
      a base layer including a plurality of resin layers;
      a plurality of pixels disposed on the base layer and overlapping the display region; and
      a charge electrode charging the stylus pen,
   wherein the plurality of resin layers include:
      a first resin layer; and
      a second resin layer disposed on the first resin layer, and
   wherein the charge electrode is disposed below the second resin layer.

21. A method for manufacturing a display device, the method comprising:
   providing a display panel including a display region and a non-display region at least partially surrounding the display region; and
   forming an input sensor including a sensing electrode on the display panel,
   wherein the providing of the display panel includes:
      providing a base including a plurality of resin layers and a charge electrode; and
      forming a plurality of pixels on the base to overlap the display region, and
   wherein the providing of the base includes:
      providing a lower resin layer;
      patterning a metal material on the lower resin layer to form the charge electrode; and
      forming an upper resin layer covering the charge electrode.

22. The method of claim 21, wherein the providing of the base further comprises forming a contact hole in the lower resin layer or the upper resin layer to electrically connect the charge electrode to a connection line.

23. The method of claim 21, wherein the providing of the display panel further comprises forming an encapsulation layer covering the plurality of pixels, and
   wherein the input sensor is formed on the encapsulation layer.

* * * * *